United States Patent
Chopra et al.

(10) Patent No.: US 10,637,540 B2
(45) Date of Patent: Apr. 28, 2020

(54) COMPRESSION OF RADIO SIGNALS WITH ADAPTIVE MAPPING

(71) Applicant: AT&T Intellectual Property I, L.P., Atlanta, GA (US)

(72) Inventors: Aditya Chopra, Austin, TX (US); Arunabha Ghosh, Austin, TX (US); Milap Majmundar, Austin, TX (US); SaiRamesh Nammi, Austin, TX (US)

(73) Assignee: AT&T INTELLECTUAL PROPERTY I, L.P., Atlanta, GA (US)

( * ) Notice: Subject to any disclaimer, the term of this patent is extended or adjusted under 35 U.S.C. 154(b) by 83 days.

(21) Appl. No.: 15/876,842

(22) Filed: Jan. 22, 2018

(65) Prior Publication Data
US 2019/0229778 A1   Jul. 25, 2019

(51) Int. Cl.
| H04L 25/00 | (2006.01) |
| H04B 1/66 | (2006.01) |
| H04B 7/0417 | (2017.01) |
| H04B 7/06 | (2006.01) |
| H03M 7/32 | (2006.01) |
| H04B 7/0456 | (2017.01) |

(52) U.S. Cl.
CPC .......... *H04B 7/0417* (2013.01); *H03M 7/302* (2013.01); *H04B 1/66* (2013.01); *H04B 7/0456* (2013.01); *H04B 7/0617* (2013.01); *H04B 7/0626* (2013.01); *H04B 7/0639* (2013.01); *H04L 25/00* (2013.01)

(58) Field of Classification Search
CPC .............................. H04B 1/66; H04B 7/0417
USPC ........................................................ 370/252
See application file for complete search history.

(56) References Cited

U.S. PATENT DOCUMENTS

| 8,503,544 | B2 | 8/2013 | Chockalingam et al. |
| 9,125,047 | B2 | 9/2015 | Sundaresan et al. |
| 9,537,556 | B2 | 1/2017 | Zhou et al. |
| 2016/0119045 | A1* | 4/2016 | Rahman ............... H04B 7/0617 375/267 |

(Continued)

FOREIGN PATENT DOCUMENTS

| CN | 102255692 A | 11/2011 |
| WO | 2013113351 A1 | 8/2013 |

(Continued)

OTHER PUBLICATIONS

Vu, et al., "Adaptive Compression and Joint Detection for Fronthaul Uplinks in Cloud Radio Access Networks," IEEE Transactions on Communications, vol. 63, No. 11, Nov. 2015, 11 pages.

*Primary Examiner* — Angel T Brockman
(74) *Attorney, Agent, or Firm* — Amin, Turocy & Watson, LLP

(57) ABSTRACT

The described technology is generally directed towards selecting a compression and/or quantization function for communicating data to and from an analog front end of a radio unit of a base station coupled to a digital baseband processor of a central unit of the base station. The compression function and/or quantization function can be adaptively and/or otherwise selected based on various criteria, such as the amount of data being transmitted, whether the data corresponds to reference signals or other data, the network architecture (e.g., digital beamforming or hybrid beamforming) in use, and so on.

20 Claims, 17 Drawing Sheets

(56) References Cited

U.S. PATENT DOCUMENTS

| | | |
|---|---|---|
| 2017/0164236 A1 | 6/2017 | Boldi et al. |
| 2017/0164336 A1 | 6/2017 | Boldi et al. |
| 2017/0237831 A1 | 8/2017 | Yang et al. |
| 2017/0238361 A1 | 8/2017 | Pawar et al. |
| 2017/0288695 A1 | 10/2017 | Feng et al. |
| 2017/0373890 A1 | 12/2017 | Fertonani et al. |

FOREIGN PATENT DOCUMENTS

| | | |
|---|---|---|
| WO | 2014076004 A2 | 5/2014 |
| WO | 2017070635 A1 | 4/2017 |
| WO | 2017152982 A1 | 9/2017 |
| WO | 2017164782 A1 | 9/2017 |
| WO | 201767370 A1 | 10/2017 |
| WO | 2017171647 A1 | 10/2017 |
| WO | 2017204704 A1 | 11/2017 |
| WO | 2018004409 A1 | 1/2018 |

* cited by examiner

COMPRESSION OF RADIO SIGNALS WITH ADAPTIVE MAPPING

TECHNICAL FIELD

The subject application is related to wireless communication systems, and, for example, to adaptively compressing data communications between base station components in a wireless communication system.

BACKGROUND

In new radio, sometimes referred to as 5G, cellular networks are being designed with cellular base stations having a split RAN (radio access network) architecture. In general, a split architecture is one in which the analogue radio front-end, referred to as the radio units, and the digital baseband processor, referred to as a central unit, are not co-located components. Instead, these components are connected via high speed serial cables. For example, multiple radio units comprising antennas, analog-to-digital converters (ADC)/digitizers, and digital-to-analog converters (DAC) may be mounted on a tower, with the central unit located at the base of the tower, where there is a power source, etc.

In new radio, sometimes referred to as 5G, cellular networks are being designed to achieve high data-rate requirements by using large communication bandwidth. However, the throughput needed for the high speed serial cables can be a limiting factor in the amount of data being communicated.

BRIEF DESCRIPTION OF THE DRAWINGS

The technology described herein is illustrated by way of example and not limited in the accompanying figures in which like reference numerals indicate similar elements and in which.

DETAILED DESCRIPTION

Figure 1:
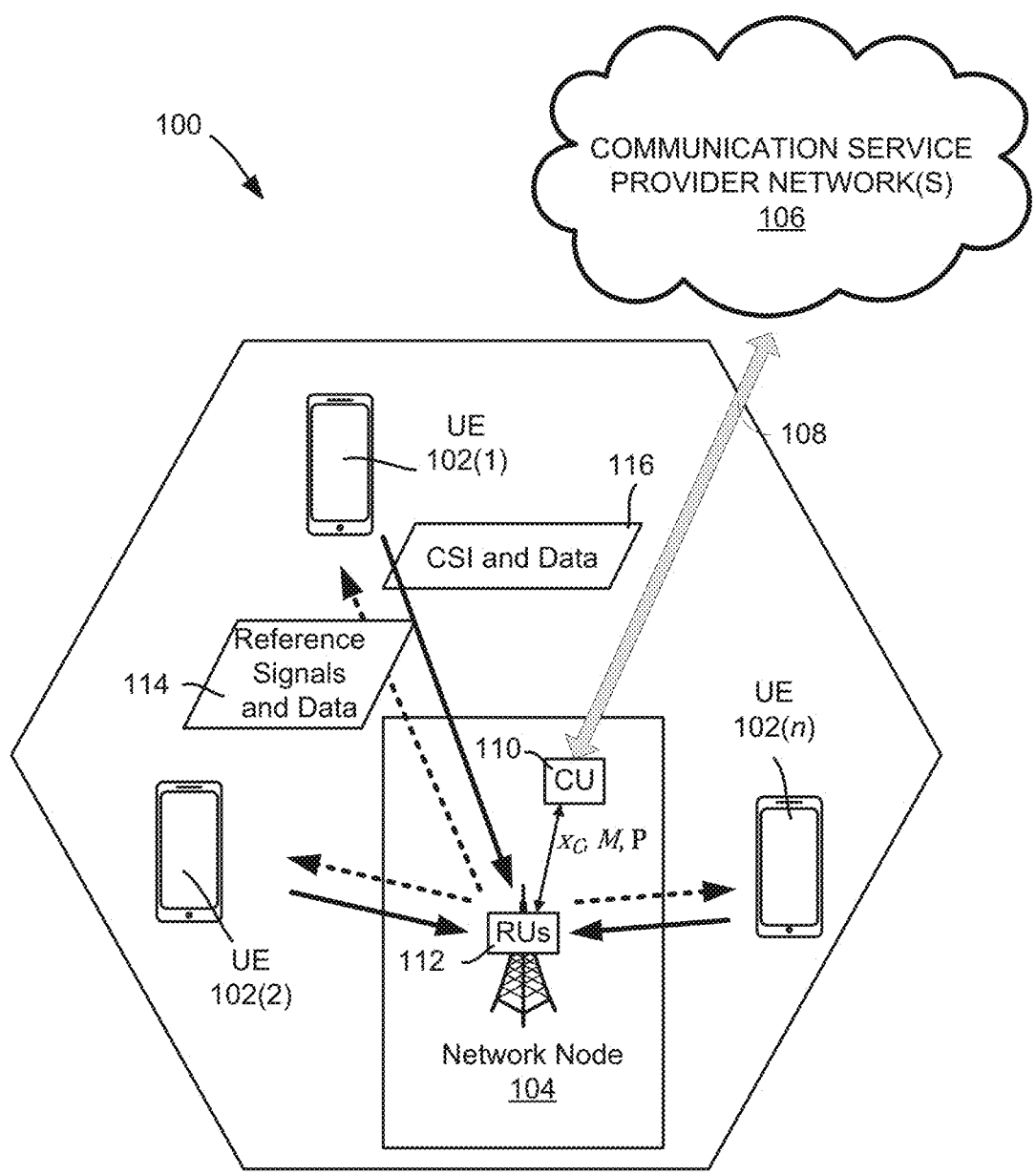
FIG. 1 illustrates an example wireless communication system in which a network node device (e.g., network node) includes a split central unit and radio units for communicating with user equipment (UE), and can implement various aspects and implementations of the subject disclosure.

Briefly, one or more aspects of the technology described herein are generally directed towards compressing data communicated over the serial link (or IP network, etc.) between a radio unit and a central unit. For uplink transmissions from a user equipment received at a radio unit, compression and quantization before sending to the central unit via the serial link provide for increased throughput over the link. The compression and/or quantization may be adaptively controlled, e.g., data from a high bandwidth user (as estimated) may be compressed and/or quantized differently relative to the data from a low bandwidth user.

For downlink transmissions from the central unit to the radio unit for transmitting to the user equipment, adaptive compression and/or quantization provides for increased throughput over the serial link in the opposite direction. The compression and/or quantization may be adaptively controlled. While it is feasible to estimate data to send, the scheduler can provide more specific information that is used to adapt compression and/or quantization.

Still further, reference signals are sent from the central unit to the radio unit for transmitting to the user equipment. In general, because estimating the channel is relatively more important, the compression of reference signals can use a different compression function, e.g., one in which more resolution is used when compressing reference signals compared to compressing data.

In another embodiment, the compression function can be different based on the network architecture. For example, the number of bits used in compression with hybrid beamforming can be different than the number of bits used in compression with digital beamforming.

In some embodiments the non-limiting term "radio network node" or simply "network node," "radio network device or simply "network device" is used herein. These terms may be used interchangeably, and refer to any type of network node that serves user equipment and/or connected to other network node or network element or any radio node from where user equipment receives signal. Examples of radio network nodes are Node B, base station (BS), multi-standard radio (MSR) node such as MSR BS, gNodeB, eNode B, network controller, radio network controller (RNC), base station controller (BSC), relay, donor node controlling relay, base transceiver station (BTS), access point (AP), transmission points, transmission nodes, RRU, RRH, nodes in distributed antenna system (DAS) etc.

In the split architecture for a cellular base station, a "radio unit" (or a "radio device," which comprises at least one radio unit) is coupled to the "central unit" (or "central device," which comprises at least one central unit) via a communications link, typically a high-speed serial cable. As is understood, in the uplink direction, although the base station receives data from the user equipment, with respect to the (e.g., serial) link the radio device is the "sender" or "transmitter" to the central unit, which is the "receiver." Conversely, in the downlink direction, although the base station transmits data to the user equipment, with respect to the (e.g., serial) link the central device is the "sender" or "transmitter" to the radio device, which is the "receiver."

In some embodiments the non-limiting term user equipment (UE) is used. It refers to any type of wireless device that communicates with a radio network node in a cellular or mobile communication system. Examples of user equipment are target device, device to device (D2D) user equipment, machine type user equipment or user equipment capable of machine to machine (M2M) communication, PDA, Tablet, mobile terminals, smart phone, laptop embedded equipped (LEE), laptop mounted equipment (LME), USB dongles etc.

FIG. 1 illustrates an example wireless communication system 100 in accordance with various aspects and embodiments of the subject technology. In one or more embodiments, the system 100 can comprise one or more user equipment UEs 102(1)-102(n).

In various embodiments, the system 100 is or comprises a wireless communication network serviced by one or more wireless communication network providers. In example embodiments, a UE 102 can be communicatively coupled to the wireless communication network via a network device 104 (e.g., network node). The network device 104 can communicate with the user equipment (UE) 102, thus providing connectivity between the UE and the wider cellular network.

In example implementations, each UE 102 such as the UE 102(1) is able to send and/or receive communication data via a wireless link to the network device 104. The dashed arrow lines from the network device 104 to the UE 102 represent downlink (DL) communications and the solid arrow lines from the UE 102 to the network devices 104 represents uplink (UL) communications.

The system 100 can further include one or more communication service provider networks 106 that facilitate providing wireless communication services to various user equipment, including UEs 102(1)-102(n), via the network device 104 and/or various additional network devices (not shown) included in the one or more communication service provider networks 106. The one or more communication service provider networks 106 can include various types of disparate networks, including but not limited to: cellular networks, femto networks, picocell networks, microcell networks, internet protocol (IP) networks Wi-Fi service networks, broadband service network, enterprise networks, cloud based networks, and the like. For example, in at least one implementation, system 100 can be or include a large scale wireless communication network that spans various geographic areas. According to this implementation, the one or more communication service provider networks 106 can be or include the wireless communication network and/or various additional devices and components of the wireless communication network (e.g., additional network devices and cell, additional UEs, network server devices, etc.).

The network device 104 can be connected to the one or more communication service provider networks 106 via one or more backhaul links 108. For example, the one or more backhaul links 108 can comprise wired link components, such as a T1/E1 phone line, a digital subscriber line (DSL) (e.g., either synchronous or asynchronous), an asymmetric DSL (ADSL), an optical fiber backbone, a coaxial cable, and the like. The one or more backhaul links 108 can also include wireless link components, such as but not limited to, line-of-sight (LOS) or non-LOS links which can include terrestrial air-interfaces or deep space links (e.g., satellite communication links for navigation).

Some embodiments are described in particular for 5G new radio systems. The embodiments are however applicable to any radio access technology (RAT) or multi-RAT system where the user equipment operates using multiple carriers e.g. LTE FDD/TDD, WCMDA/HSPA, GSM/GERAN, Wi Fi, WLAN, WiMax, CDMA2000 etc.

The embodiments are applicable to single carrier as well as to multicarrier (MC) or carrier aggregation (CA) operation of the user equipment. The term carrier aggregation (CA) is also called (e.g. interchangeably called) "multi-carrier system", "multi-cell operation", "multi-carrier operation", "multi-carrier" transmission and/or reception.

Note that the solutions outlined equally applies for Multi RAB (radio bearers) on some carriers (that is data plus speech is simultaneously scheduled). Some embodiments are described in particular for 5G new radio systems. The embodiments are however applicable to any radio access technology (RAT) or multi-RAT system where the user equipment operates using multiple carriers e.g. LTE FDD/TDD, WCMDA/HSPA, GSM/GERAN, Wi Fi, WLAN, WiMax, CDMA2000 etc.

The embodiments are applicable to single carrier as well as to multicarrier (MC) or carrier aggregation (CA) operation of the user equipment. The term carrier aggregation (CA) is also called (e.g. interchangeably called) "multi-carrier system", "multi-cell operation", "multi-carrier operation", "multi-carrier" transmission and/or reception.

Note that the solutions outlined equally applies for Multi RAB (radio bearers) on some carriers (that is, data plus speech is simultaneously scheduled).

The wireless communication system 100 can employ various cellular systems, technologies, and modulation schemes to facilitate wireless radio communications between devices (e.g., the UE 102 and the network device 104). While example embodiments might be described for 5G new radio (NR) systems, the embodiments can be applicable to any radio access technology (RAT) or multi-RAT system where the UE operates using multiple carriers e.g. LTE FDD/TDD, GSM/GERAN, CDMA2000 etc. For example, the system 100 can operate in accordance with global system for mobile communications (GSM), universal mobile telecommunications service (UMTS), long term evolution (LTE), LTE frequency division duplexing (LTE FDD), LTE time division duplexing (TDD), high speed packet access (HSPA), code division multiple access (CDMA), wideband CDMA (WCMDA), CDMA2000, time division multiple access (TDMA), frequency division multiple access (FDMA), multi-carrier code division multiple access (MC-CDMA), single-carrier code division multiple access (SC-CDMA), single-carrier FDMA (SC-FDMA), orthogonal frequency division multiplexing (OFDM), discrete Fourier transform spread OFDM (DFT-spread OFDM) single carrier FDMA (SC-FDMA), Filter bank based multi-carrier (FBMC), zero tail DFT-spread-OFDM (ZT DFT-s-OFDM), generalized frequency division multiplexing (GFDM), fixed mobile convergence (FMC), universal fixed mobile convergence (UFMC), unique word OFDM (UW-OFDM), unique word DFT-spread OFDM (UW DFT-Spread-OFDM), cyclic prefix OFDM CP-OFDM, resource-block-filtered OFDM, Wi Fi, WLAN, WiMax, and the like. However, various features and functionalities of system 100 are particularly described wherein the devices (e.g., the UEs 102 and the network device 104) of system 100 are configured to communicate wireless signals using one or more multi carrier modulation schemes, wherein data symbols can be transmitted simultaneously over multiple frequency subcarriers (e.g., OFDM, CP-OFDM, DFT-spread OFMD, UFMC, FMBC, etc.). The embodiments are applicable to single carrier as well as to multicarrier (MC) or carrier aggregation (CA) operation of the UE. The term carrier aggregation (CA) is also called (e.g. interchangeably called) "multi-carrier system", "multi-cell operation", "multi-carrier operation", "multi-carrier" transmission and/or reception. Note that some embodiments are also applicable for Multi RAB (radio bearers) on some carriers (that is data plus speech is simultaneously scheduled).

In various embodiments, the system 100 can be configured to provide and employ 5G wireless networking features and functionalities. With 5G networks that may use waveforms that split the bandwidth into several sub bands, different types of services can be accommodated in different sub bands with the most suitable waveform and numerology, leading to improved spectrum utilization for 5G networks. Notwithstanding, in the mmWave spectrum, the millimeter waves have shorter wavelengths relative to other communications waves, whereby mmWave signals can experience severe path loss, penetration loss, and fading. However, the shorter wavelength at mmWave frequencies also allows more antennas to be packed in the same physical dimension, which allows for large-scale spatial multiplexing and highly directional beamforming.

Performance can be improved if both the transmitter and the receiver are equipped with multiple antennas. Multi-antenna techniques can significantly increase the data rates and reliability of a wireless communication system. The use of multiple input multiple output (MIMO) techniques, which was introduced in the third-generation partnership project (3GPP) and has been in use (including with LTE), is a multi-antenna technique that can improve the spectral efficiency of transmissions, thereby significantly boosting the overall data carrying capacity of wireless systems. The use of multiple-input multiple-output (MIMO) techniques can improve mmWave communications; MIMO can be used for achieving diversity gain, spatial multiplexing gain and beamforming gain.

Note that using multi-antennas does not always mean that MIMO is being used. For example, a configuration can have two downlink antennas, and these two antennas can be used in various ways. In addition to using the antennas in a 2×2 MIMO scheme, the two antennas can also be used in a diversity configuration rather than MIMO configuration. Even with multiple antennas, a particular scheme might only use one of the antennas (e.g., LTE specification's transmission mode 1, which uses a single transmission antenna and a single receive antenna). Or, only one antenna can be used, with various different multiplexing, precoding methods etc.

The MIMO technique uses a commonly known notation (M×N) to represent MIMO configuration in terms number of transmit (M) and receive antennas (N) on one end of the transmission system. The common MIMO configurations used for various technologies are: (2×1), (1×2), (2×2), (4×2), (8×2) and (2×4), (4×4), (8×4). The configurations represented by (2×1) and (1×2) are special cases of MIMO known as transmit diversity (or spatial diversity) and receive diversity. In addition to transmit diversity (or spatial diversity) and receive diversity, other techniques such as spatial multiplexing (comprising both open-loop and closed-loop), beamforming, and codebook-based precoding can also be used to address issues such as efficiency, interference, and range.

In FIG. 1, as described herein, the network node has a split architecture comprising a central unit 110 and a number of radio units 112. The network node, via the central unit and a radio unit, is configured to provide reference signals and data 114 to a user equipment (e.g., 102(1)), which returns Channel Status Information (CSI) and data to the network node 104.

For inter-node communications between the radio unit and the central unit, in a split RAN architecture, the amount of unidirectional throughput for such radios can be expressed as $$T=2NBM$$

where T is the throughput in bits/sec, N is the number of antennas, B is the signal bandwidth in Hz, and M is the number of bits used to quantized each of the in-phase and quadrature signals. By way of example, for a typical 5G scenario with 8 antennas and 200 MHz bandwidth, the throughput is equal to 400*M megabytes/sec. A typical ADC uses 16 bits for quantization, yielding 6.4 gigabytes/sec. From this analysis, while the number of antennas and the bandwidth are decided by the standardization and performance requirements, the number of effective bits used to quantize the I and Q signals can yield significant reduction in throughput. The technology described herein provides a scheme to quantize the I and Q signals to reduce the throughput yet still meet signal integrity requirements. To this end, the communications between the radio units and the central units may be compressed, including via different compression functions adapted for different criteria.

Figure 2:
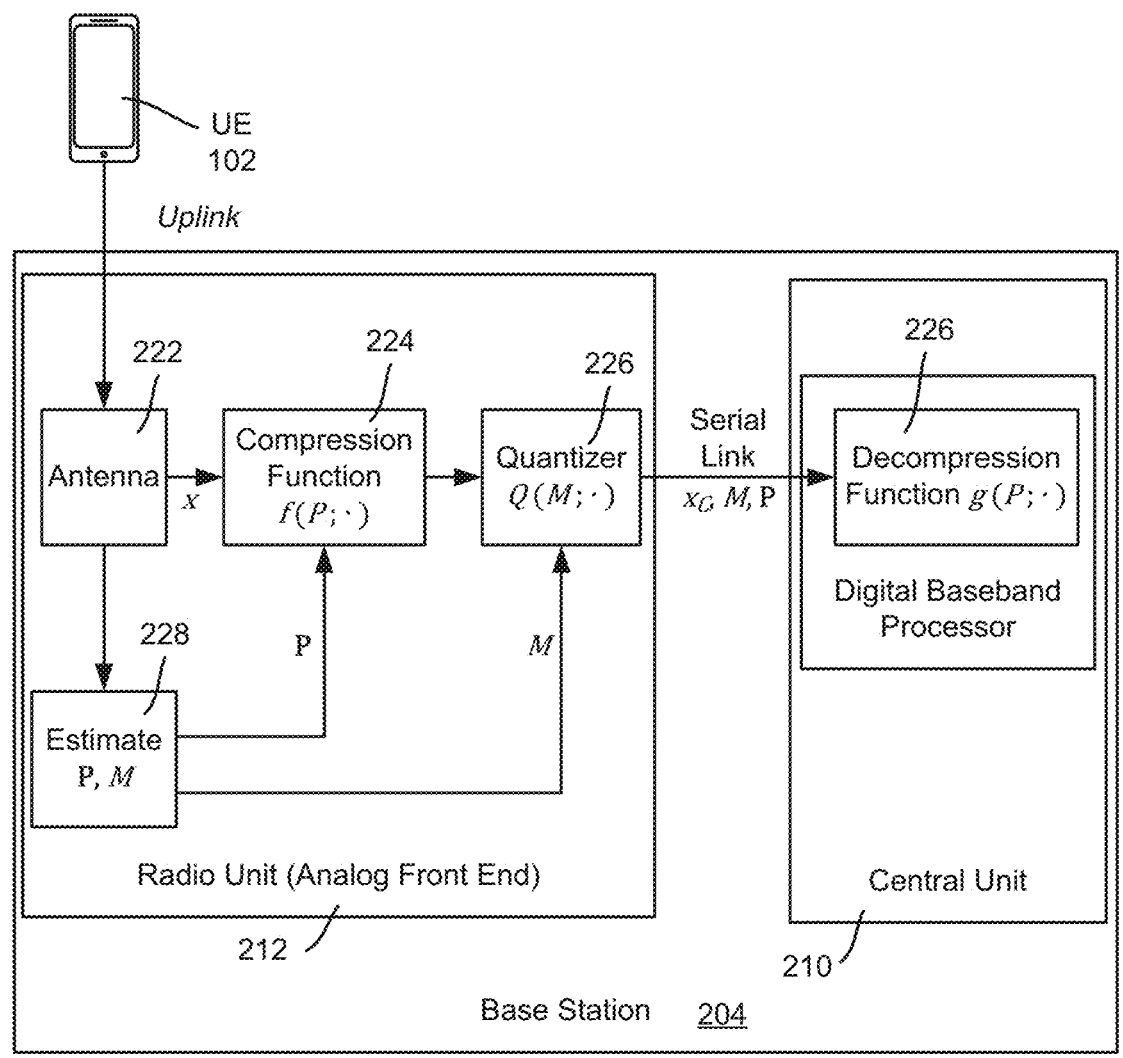
FIG. 2 illustrates an example network node represented as a base station, comprising a radio unit that compresses uplink data before sending to the central unit, in accordance with various aspects and implementations of the subject disclosure.

FIG. 2 initially shows a block diagram representing uplink transmissions received at an antenna 222 of a radio unit 212 of a network node comprising a base station 204. As can be seen, the analog data x is compressed by compression function 224, quantized by quantizer 226 before being sent over the serial link to the central unit. Note that along with the compressed, quantized data xc, the compression parameter vector P and quantization parameter M are sent to the central unit in this example, because these can vary as adapted for different data being transmitted.

In one example, a finite set of real numbers $\{x_1, x_2, \ldots x_K\}$, $(x_i \in S \forall i)$ is considered for quantization. A bijective mapping function is established at both the compressor and the decompressor (decompression function 228). The compression mapping function 224 is denoted by $f(P; \cdot): S \rightarrow [-1,1)$, where P is the parameter vector that defines this function. The decompression mapping is denoted by $g(P; \cdot): [-1,1) \rightarrow S$, such that $g(P; f(P; x)) = x \forall x \in S$. A uniform quantizer 226 can be represented as if $Q(M; x): [-1,1) \rightarrow [-1,1)$ where M is the number of bits used for quantization.

$$Q(M; x) = \frac{\lfloor 2^{M-1} x \rfloor}{2^{M-1}}.$$

The selection of compression and decompression function depends on individual embodiments, and can be lossy or lossless. For example, one embodiment may use log companding, e.g., A-law mapping, such that $$f(A; x) = \text{sgn}(x) \begin{cases} \frac{A|x|}{1 + \log(A)}, & |x| < \frac{1}{A} \\ \frac{1 + \log(A|x|)}{1 + \log(A)}, & \frac{1}{A} \leq x < 1 \end{cases}$$

where P=A, e.g., A can be any number from 1 to infinity. Note that the compression parameter vector P is a generalized vector that can be based on a single parameter A or based on more parameters, e.g., A, B and C.

It should be noted that different compression and decompression functions may be present at the sender and the receiver and chosen based on any criterion. For example, compression function 1 or compression function 2 may be available at the sender, and as long as the sender communicates (or the receiver can otherwise determine) which one is being used, the receiver can select the counterpart decompression function.

The estimation (block 228) of the parameter vector P and the quantization parameter M are selective, and can be adapted based on one or more different criteria. The block size K used during compression is also selectable. For example, some users need a lot of throughput, some users need far less. For example, for lower throughput, fewer compression bits may be used, whereas for high throughput, more compression bits may be used. Note that for downlink communications, the scheduler knows in advance what throughput is needed, the type of data and so on, and thus scheduler assisted compression and/or quantization can be used.

Figure 3:
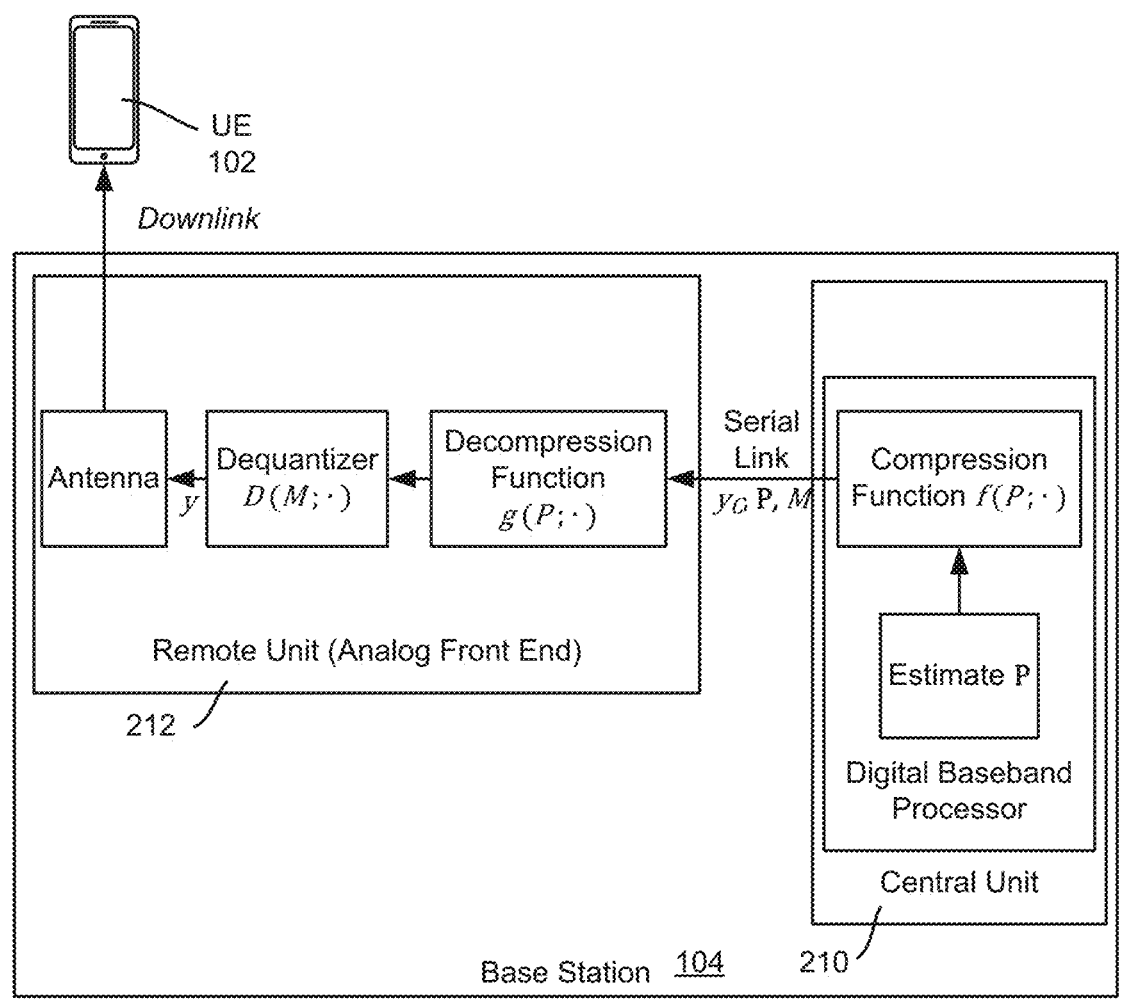
FIG. 3 illustrates an example network node represented as a base station, comprising a central unit that compresses downlink data before sending to the radio unit, in accordance with various aspects and implementations of the subject disclosure.
Figure 4:
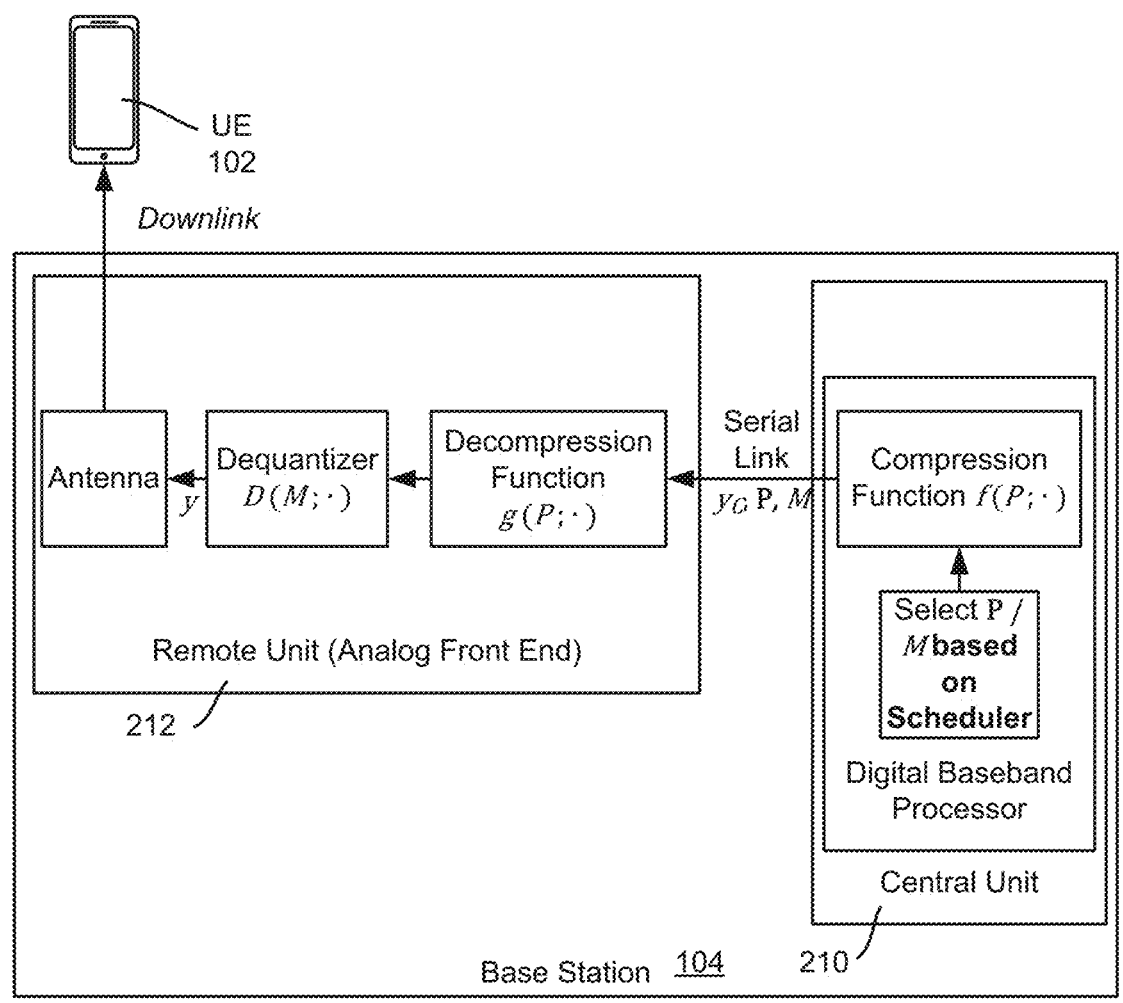
FIG. 4 illustrates an example network node represented as a base station, comprising a central unit that compresses downlink data based on scheduler information before sending to the radio unit, in accordance with various aspects and implementations of the subject disclosure.

FIGS. 3 and 4 show downlink counterpart diagrams in which the central unit 210 is the sender to the remote unit 212. As can be seen, data can be compressed at the central unit and decompressed/dequantized at the remote unit 212. In FIG. 3, the compression vector is estimated, whereas in FIG. 4, the compression vector is based on information known to the scheduler.

Note that for downlink data transmission, reference signals are used to estimate the channel between the base station and the user equipment. In general, because estimating the channel is relatively important for decoding data, reference signals can use a different compression function, e.g., one in which more resolution is used for reference signals compared to the compression function used for data. For example, a 4-bit compressor may be used for data, with 8-bit or 16-bit compression is used for reference signals.

Figure 5:
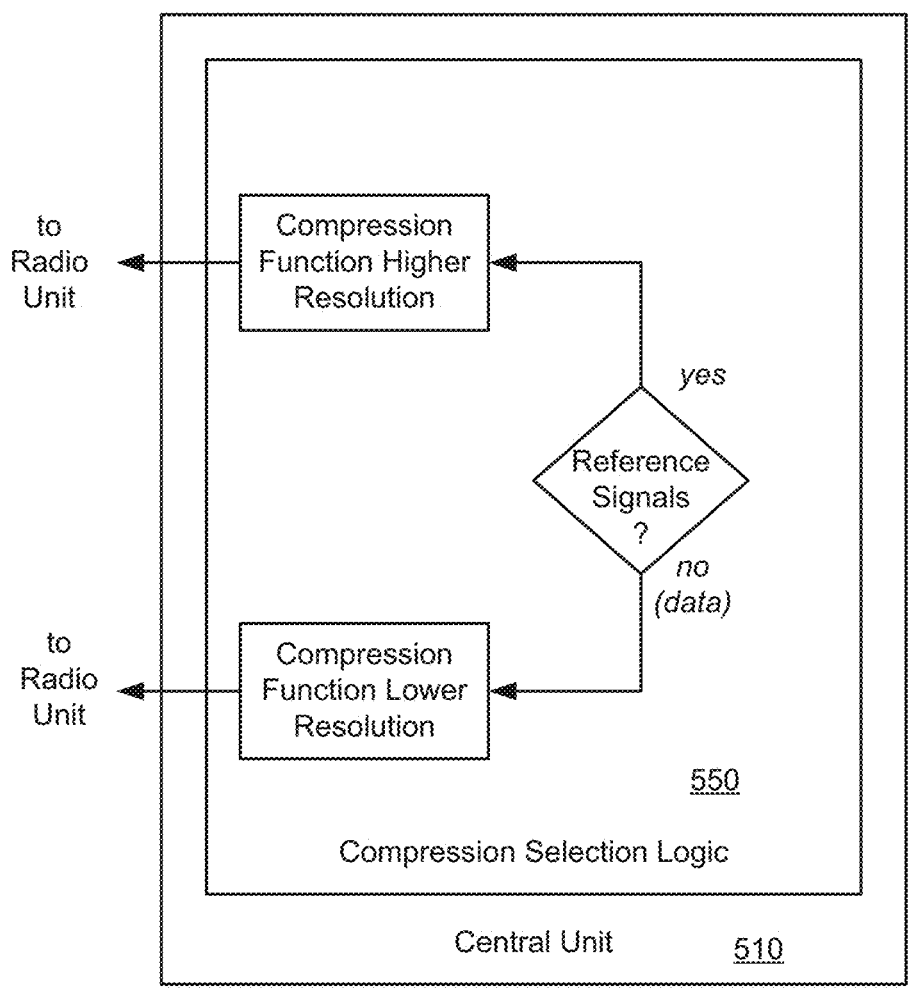
FIG. 5 is an example representation of the central unit that compresses reference signals differently from data for sending through a radio unit (and then to user equipment), in accordance with various aspects and implementations of the subject disclosure.

Note that 5G standards define various reference signals such as CSI-RS, (channel state information reference signals), DMRS (demodulation reference signals), PTRS (phase-tracking reference signals), SRS (sounding reference signals), etc. In one embodiment represented in FIG. 5, the reference signals are compressed by compression selection logic 550 of the central unit 510 with the same compression function. The data is compressed with a different (e.g., lower resolution) compression function.

Figure 6:
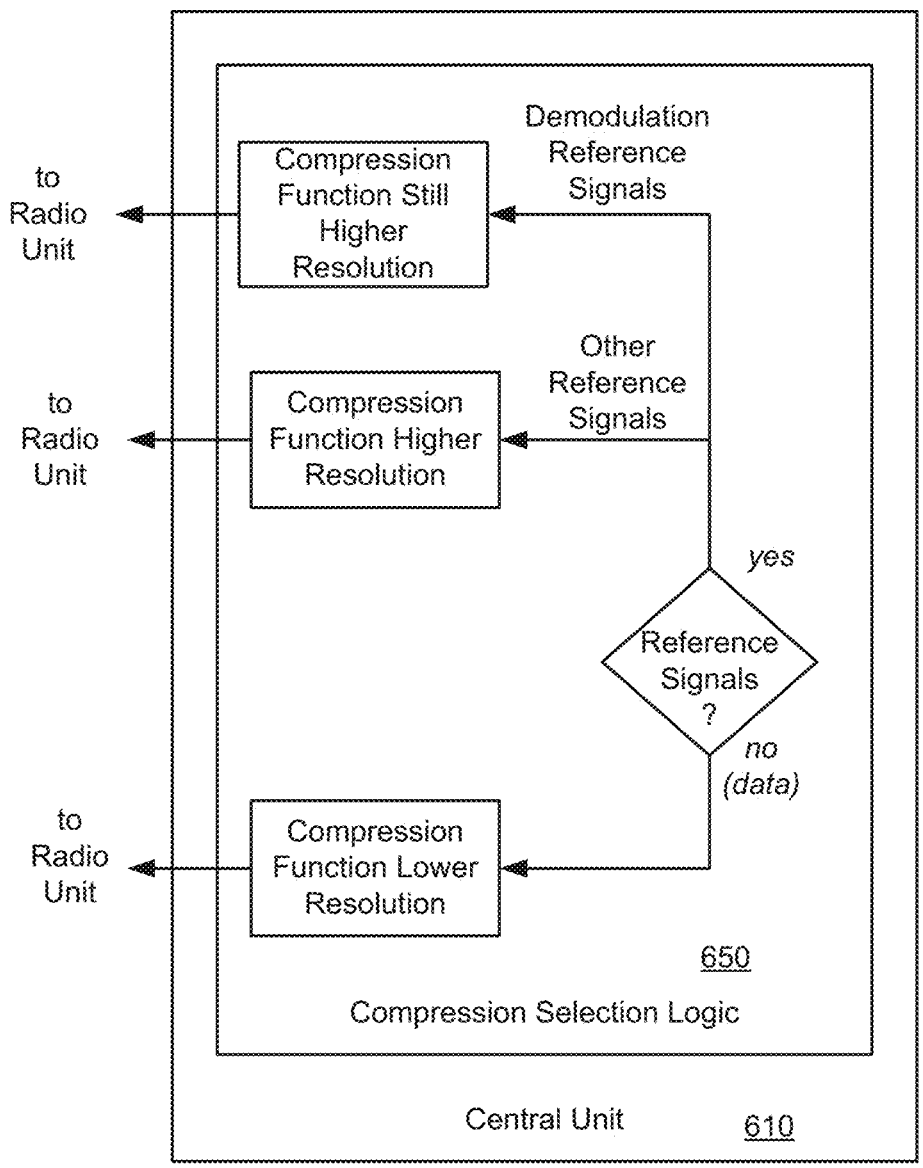
FIG. 6 is an example representation of the central unit that compresses demodulation reference signals, other reference signals and data differently for sending through a radio unit (and then to user equipment), in accordance with various aspects and implementations of the subject disclosure.

In contrast, as represented in the alternative embodiment of FIG. 6, the demodulation reference signal uses a still higher resolution (more robust) compression function relative to the other reference signals and data. This alternative is represented by compression selection logic 650 of a central unit 610 Note that the other reference signals may use the same compression function as used for the data, or different compression functions for the other reference signals and data (as in FIG. 6).

It should be understood that data returned from the user equipment may likewise be compressed differently based on its purpose. For example, the CSI report from the user equipment received at the radio unit may be compressed differently relative to how other data is compressed, before sending to the central unit.

Turning to another aspect, the compression function can different based on the network architecture. For example, in downlink transmission, if hybrid beamforming is used, then the number of bits for compression can be Y, whereas with digital beamforming, the number of bits for compression is different compared to Y; (in general it is less than Y). Hence if the network knows the architecture, the network can adapt the number of bits for compression. Note that same procedure applies for de-compression.

Figure 7:
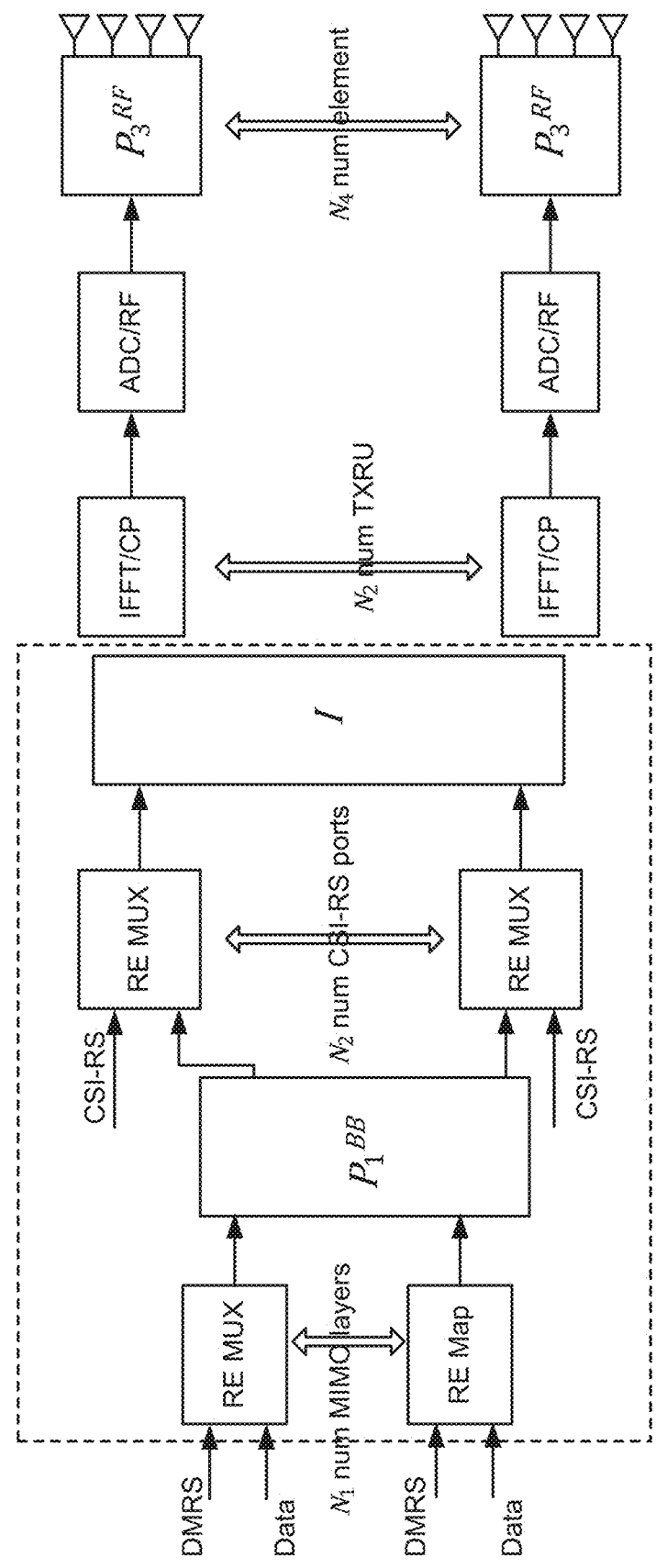
FIG. 7 is a block diagram representing a hybrid beamforming architecture, which can use different compression from compression used in other architectures, in accordance with various aspects and implementations of the subject disclosure.
Figure 8:
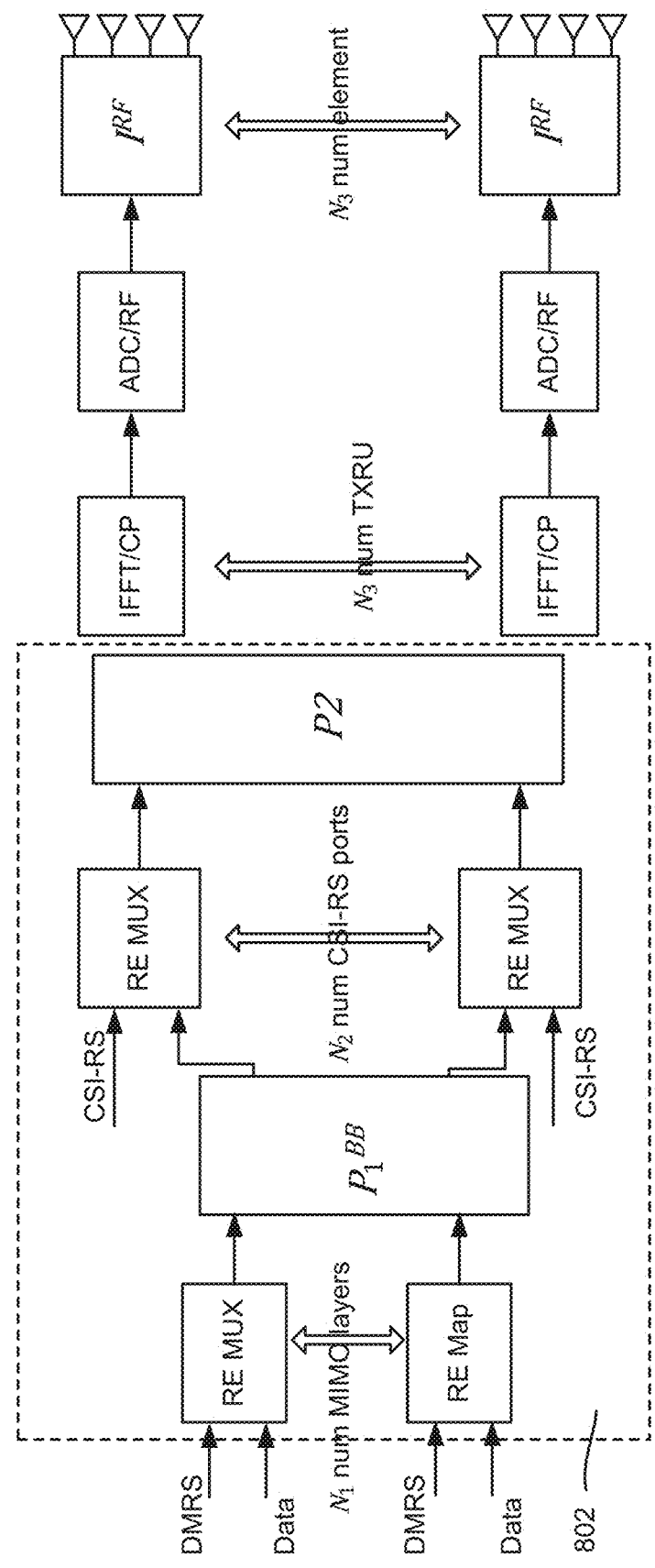
FIG. 8 is a block diagram representing a full digital beamforming architecture, which can use different compression from compression used in other architectures, in accordance with various aspects and implementations of the subject disclosure.

FIG. 7 represents hybrid beamforming, while FIG. 8 represents full digital beamforming. In general, baseband precoding includes both P1 and P2 as shown inside the dashed box 802 of FIG. 8. The matrix product of P1×P2 is the effective precoder; P1×P2 is fixed within a scheduling granularity (L PRB×M symbols). Note that P1 is based on explicit feedback (e.g. PMI), however P1 can be different from PMI e.g. for MU-MIMO, Codebook restriction, Non-linear precoding e.g., THP. P1 is user equipment specific and P1 can be sub-band or wide-band.

For RF beamforming, in general analog beamforming is represented as the stage P3 (FIG. 7). The actual weights are based on a given implementation, but in general the index is obtained via beam management procedures for NR. Note that in the hybrid beamforming of FIG. 7, with respect to the wide RF beams, in LTE P3 is fixed; in NR, P3 is obtained via beam management procedures and in NR, P3 is user equipment specific. P3 is always wideband and the same across all CC.

For full digital beamforming, in TDD, P2 is based on TDD Reciprocity, and in FDD, P2 is based on CRI (CSI-RS feedback). FDD P2 can also be based on reciprocity. P2 can be UE specific or cell specific, which depends on a given implementation. P2 can be sub-band or wideband.

Figure 9:
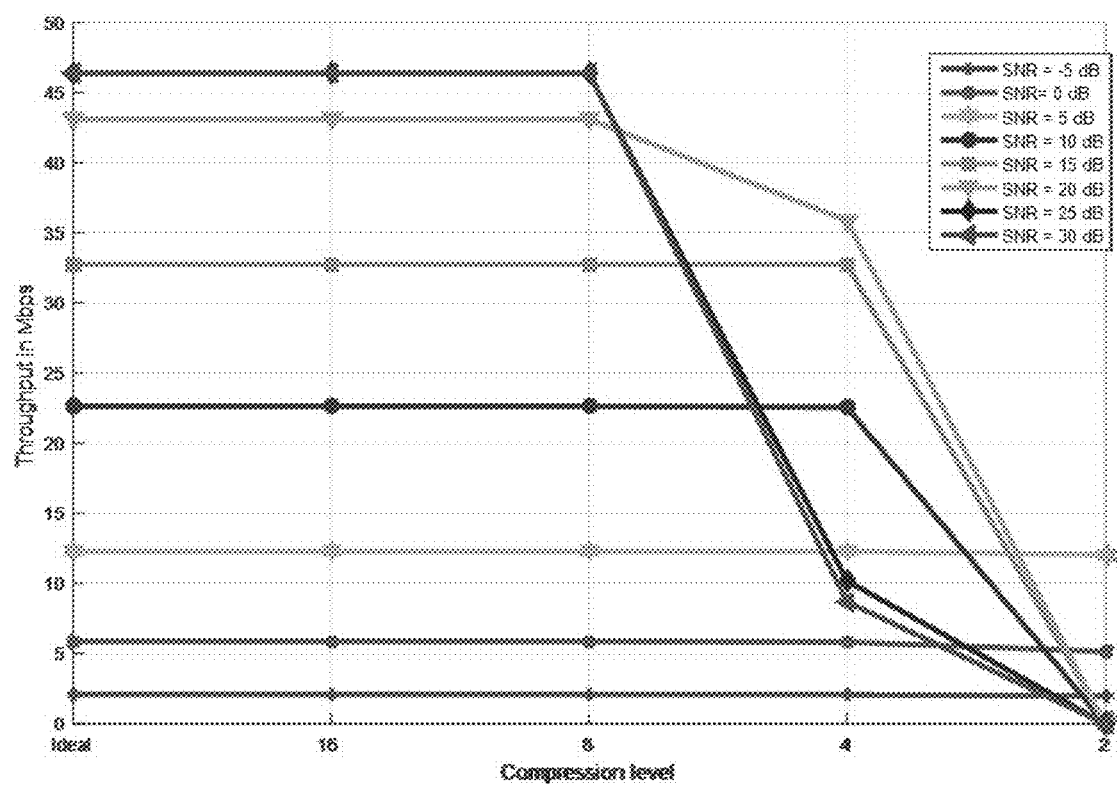
FIG. 9 is a graphical representation of simulation results for compression in a hybrid beamforming architecture, in accordance with various aspects and implementations of the subject disclosure.
Figure 10:
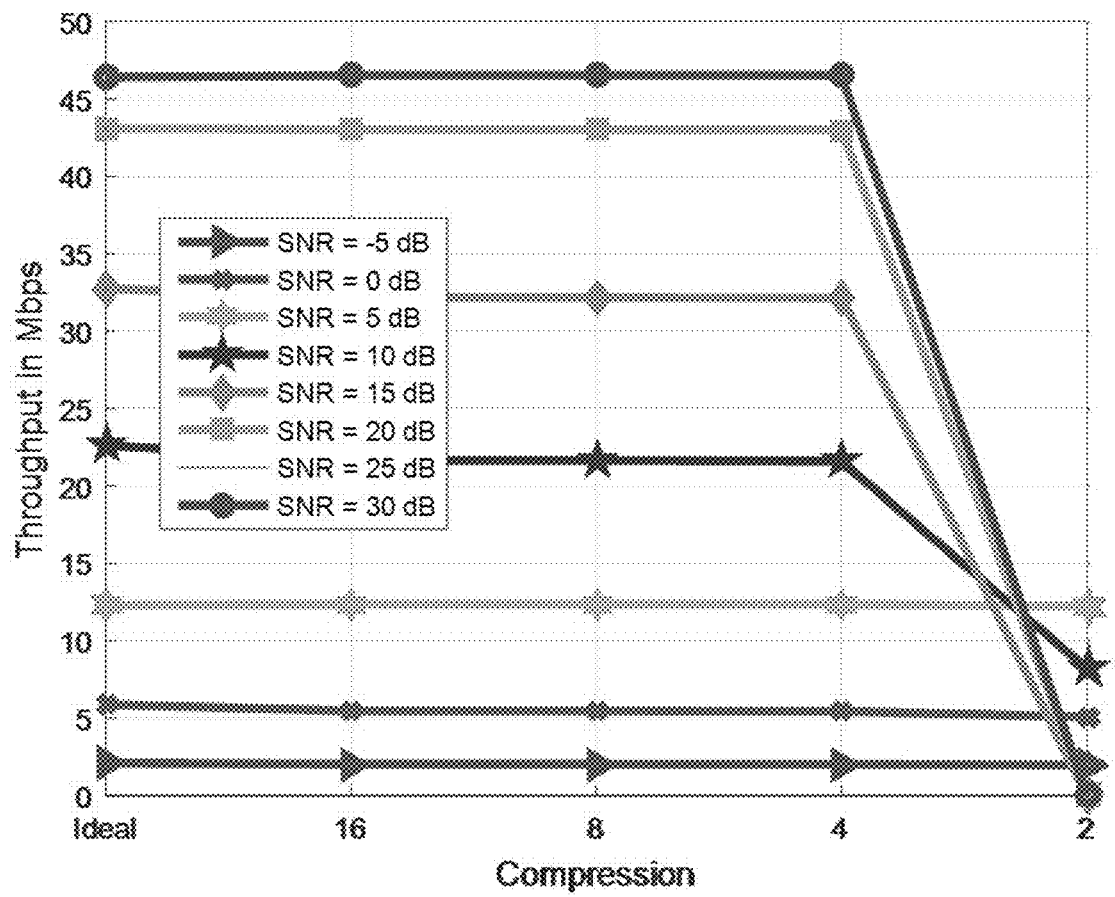
FIG. 10 is a graphical representation of a downlink analysis for compression in a full digital beamforming architecture, in accordance with various aspects and implementations of the subject disclosure.

FIG. 9 represents a graph of throughput versus compression level simulation results for hybrid beamforming. FIG. 10 represents a graph of throughput versus compression for a downlink analysis with all digital beamforming.

Figure 11:
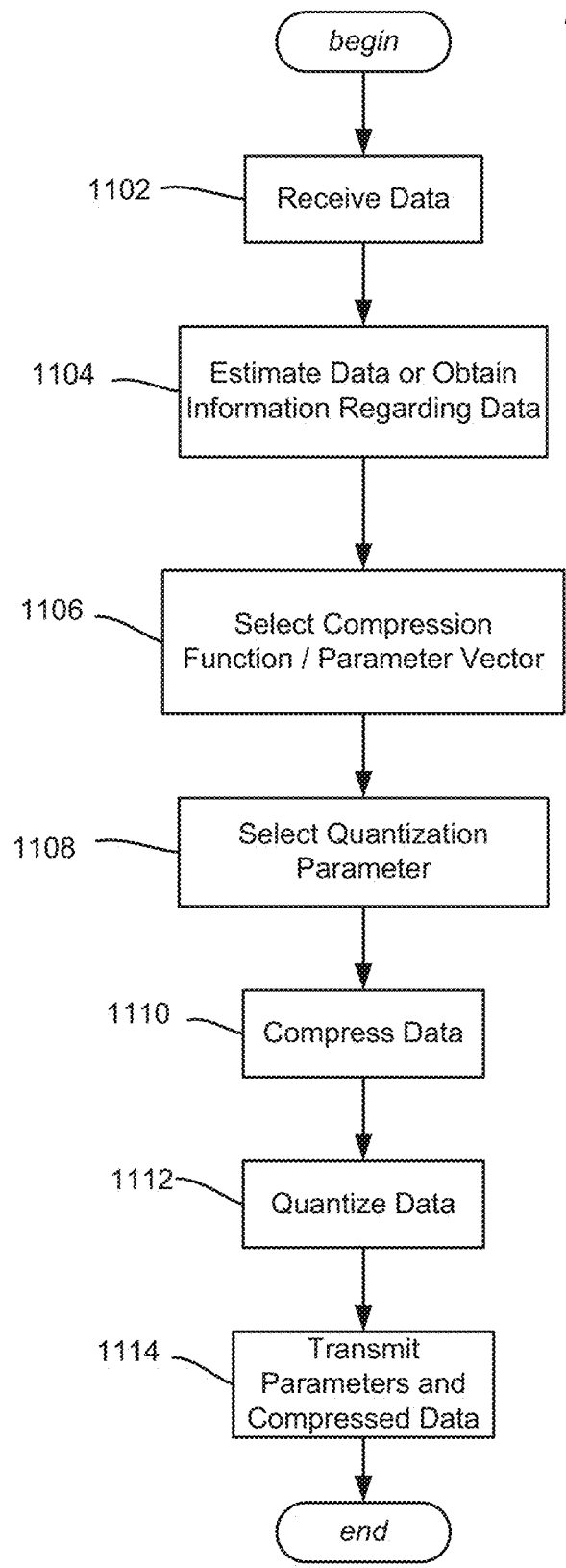
FIG. 11 illustrates an example flow diagram of network device operations for compressing data for sending over a link in a split base station, in accordance with various aspects and implementations of the subject disclosure.

FIG. 11 is a flow diagram representing example operations that may be performed by a radio base station component that is compressing data for sending on the link to a receiver component in the base station. Operation 1102 represents receiving data, and operation 1104 represents estimating the data or obtaining information regarding the data from which compression/quantization parameters may be selected. Operation 1106 selects the compression function, which may be to select the parameter vector as described herein. Operation 1108 selects the quantization parameter. Note that the quantization parameter may be tied to the parameter vector, that is one is known from the other at both the sender and receiver, in which event there is no reason to send both to the receiver.

Operation 1110 represents compressing the data and operation 1112 represents quantizing the data. Operation 1114 represents transmitting the parameters and compressed data to the receiver.

Figure 12:
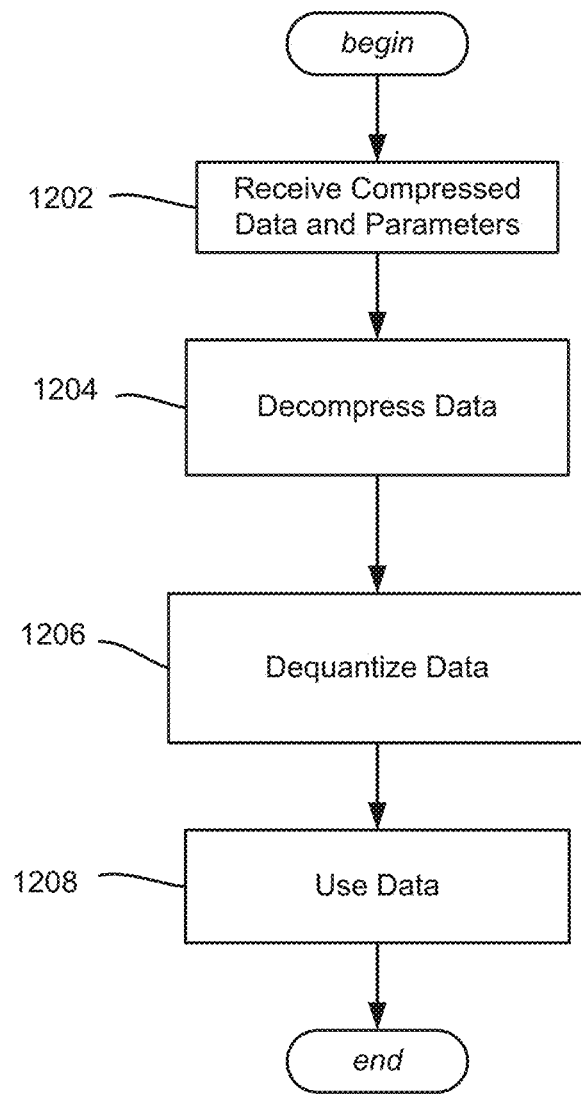
FIG. 12 illustrates an example flow diagram of network device operations for decompressing data received over a link in a split base station, in accordance with various aspects and implementations of the subject disclosure.

FIG. 12 as a flow diagram representing example operations that may be performed by radio base station component that is decompressing data received on the link from a sender component of the base station. Step 1202 represents receiving the compressed data and parameters, and step 1204 represents decompressing the compressed data. Step 1206 represents the quantizing the data, and step 1208 represents using the data in some way. For example, the data may be converted to analog for sending to a user equipment, or the data may be analyzed for estimating the channel.

Figure 13:
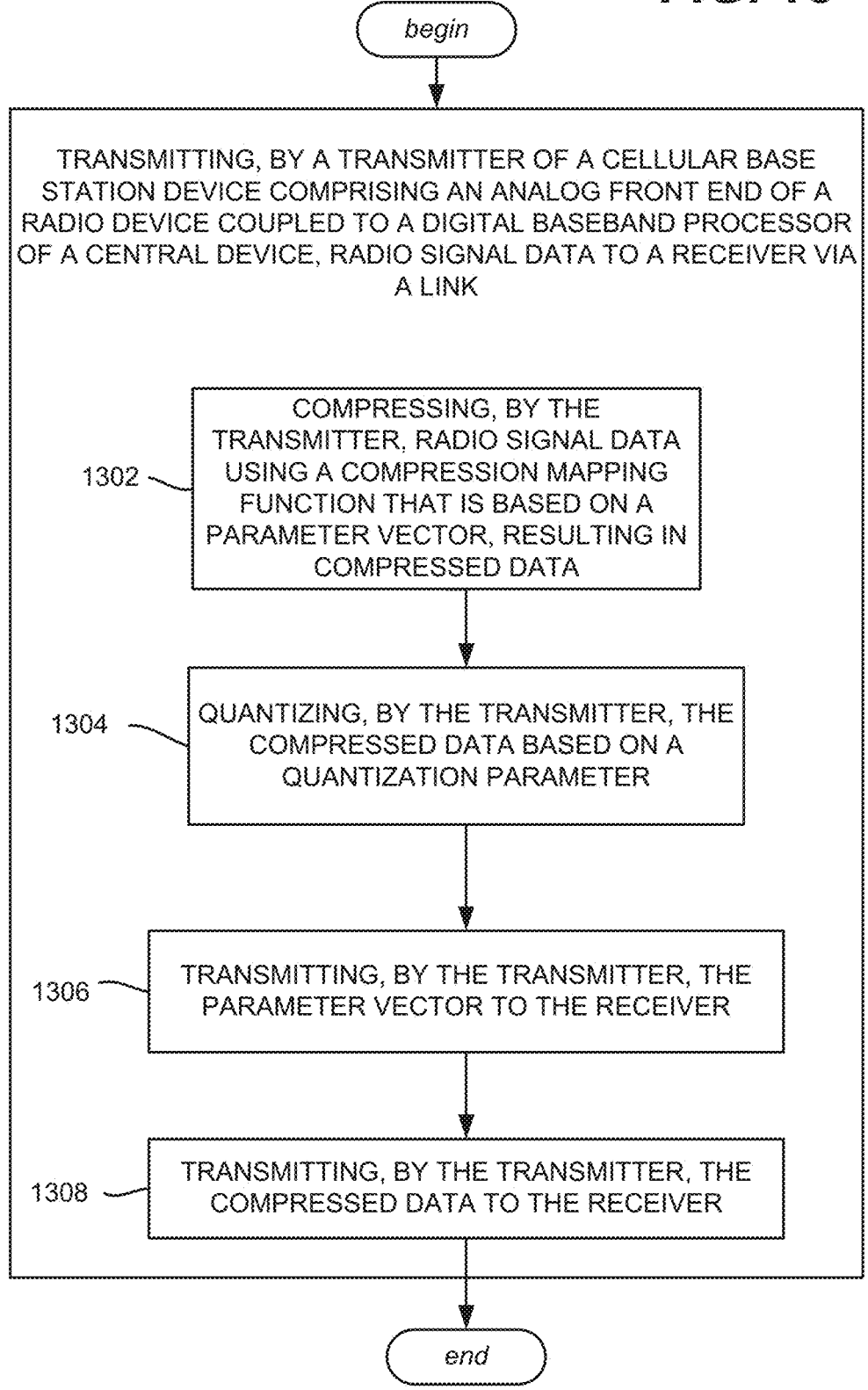
FIG. 13 illustrates an example flow diagram of network device operations for compressing data, in accordance with various aspects and implementations of the subject disclosure, in accordance with various aspects and implementations of the subject disclosure.

One or more aspects, generally represented in FIG. 13, are generally directed towards transmitting, by a transmitter of a cellular base station device comprising an analog front end of a radio device coupled to a digital baseband processor of a central device, radio signal data to a receiver via a link Operations associated with the transmitting can comprise compressing (operation 1302), by the transmitter, radio signal data using a compression mapping function that is based on a parameter vector, resulting in compressed data and quantizing (operation 1304), by the transmitter, the compressed data based on a quantization parameter. Example operation 1306 represents transmitting, by the transmitter, the parameter vector to the receiver; and example operation 1308 represents transmitting, by the transmitter, the compressed data to the receiver.

The radio device can operate as the transmitter of the cellular base station device, the compressed data can correspond to uplink data, and further operations can comprise determining, by the radio device, the parameter vector based on an estimated amount of the uplink data. Further operations associated with the transmitting can comprise transmitting, by the transmitter, the quantization parameter to the receiver. The radio device can operate as the transmitter of the cellular base station device, the compressed data can correspond to uplink data, and further operations can comprise determining, by the radio device, the quantization parameter based on an estimated amount of the uplink data. The central device can operate as the transmitter of the cellular base station device, the compressed data can correspond to downlink data, and further operations can comprise determining, by the central device, the parameter vector based on information received from a scheduler. The central device can operate as the transmitter of the cellular base station device, the compressed data can correspond to downlink data, and further operations can comprise determining, by the central device, the quantization parameter based on an estimated amount of the downlink data.

Transmitting the compressed data to the receiver can comprise transmitting the compressed data via a serial link or an IP network.

Further operations can comprise estimating a channel between the base station and a user equipment using reference signals originating from the central device. The compression mapping function that compresses the radio signal data can be a first compression mapping function, and the operations associated with the transmitting can comprise compressing, by the transmitter, the reference signals with a second compression mapping function having a higher resolution than a resolution of the first compression mapping function.

The compression mapping function that compresses the radio signal data can be a first compression mapping function, and the operations associated with the transmitting can comprise compressing, by the transmitter, a demodulation reference signal of the reference signals with a second compression mapping function that is different than the first compression mapping function.

Further operations can comprise selecting, by the transmitter, a number of bits for the compressing based on a network architecture determined to be applicable to the cellular base station device.

Figure 14:
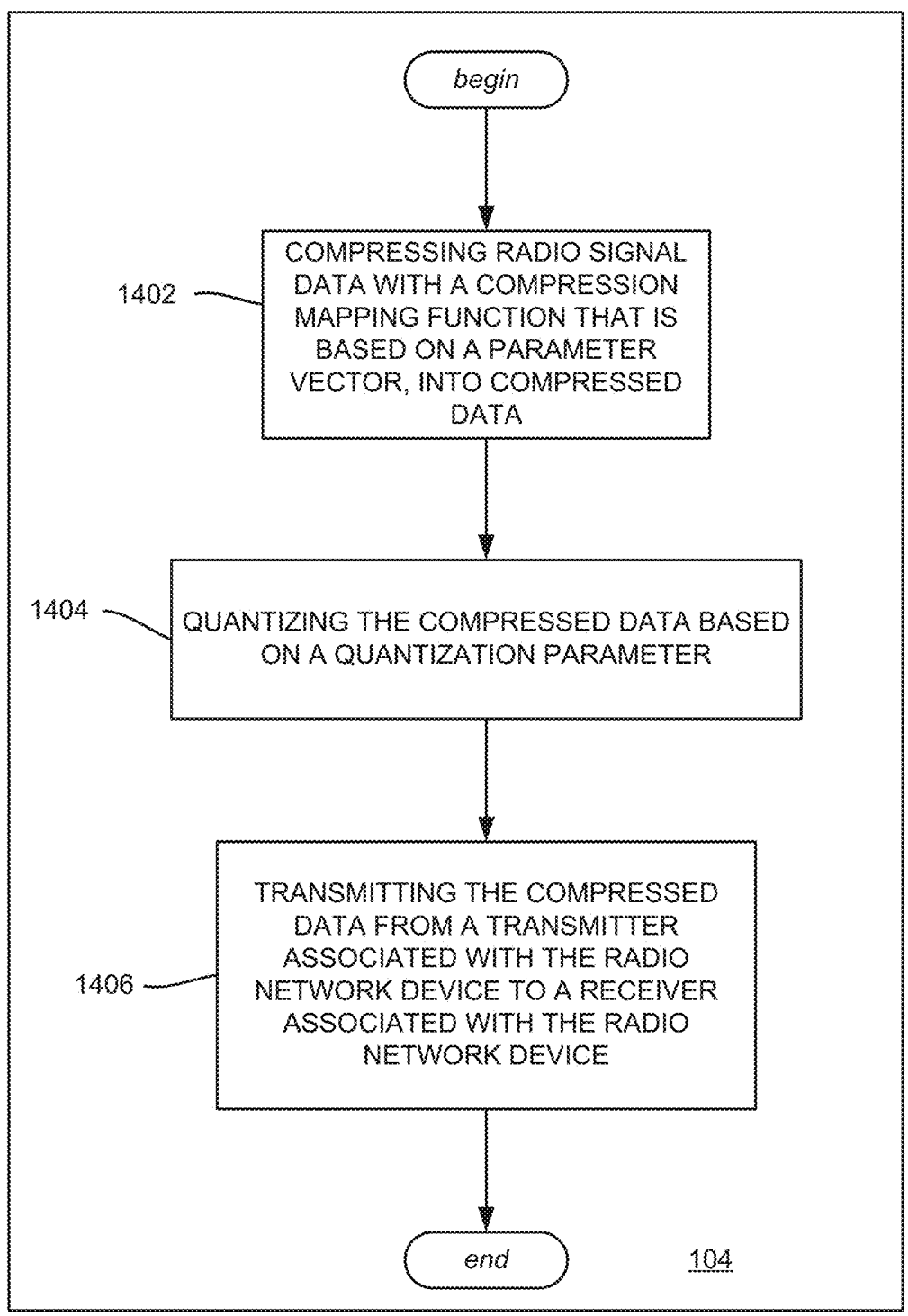
FIG. 14 illustrates an example flow diagram of a network device including operations for compressing data, in accordance with various aspects and implementations of the subject disclosure, in accordance with various aspects and implementations of the subject disclosure.

An example embodiment of a network device 104 comprising a processor and a memory that stores executable instructions that, when executed by the processor, facilitate performance of operations, is represented in FIG. 14. Example operations can include compressing radio signal data with a compression mapping function that is based on a parameter vector, into compressed data (operation 1402). Operation 1404 represents quantizing the compressed data based on a quantization parameter. Operation 1406 represents transmitting the compressed data from a transmitter associated with the radio network device to a receiver associated with the radio network device.

Other operations can comprise transmitting the parameter vector and quantization parameter to the receiver. Still other operations can comprise receiving the parameter vector and quantization parameter at the receiver, and decompressing the compressed data by the receiver.

The transmitter can comprise a central device, and further operations can comprise estimating a channel between a user equipment and the radio network device based on reference signals sent from the transmitter to the receiver. Other operations can comprise compressing the reference signals sent from the transmitter to the receiver.

Further operations can comprise compressing the reference signals sent from the transmitter to the receiver, comprising using a first reference signal compression function for demodulation reference signals and a second reference signal compression function for other reference signals other than the demodulation reference signals.

Figure 15:
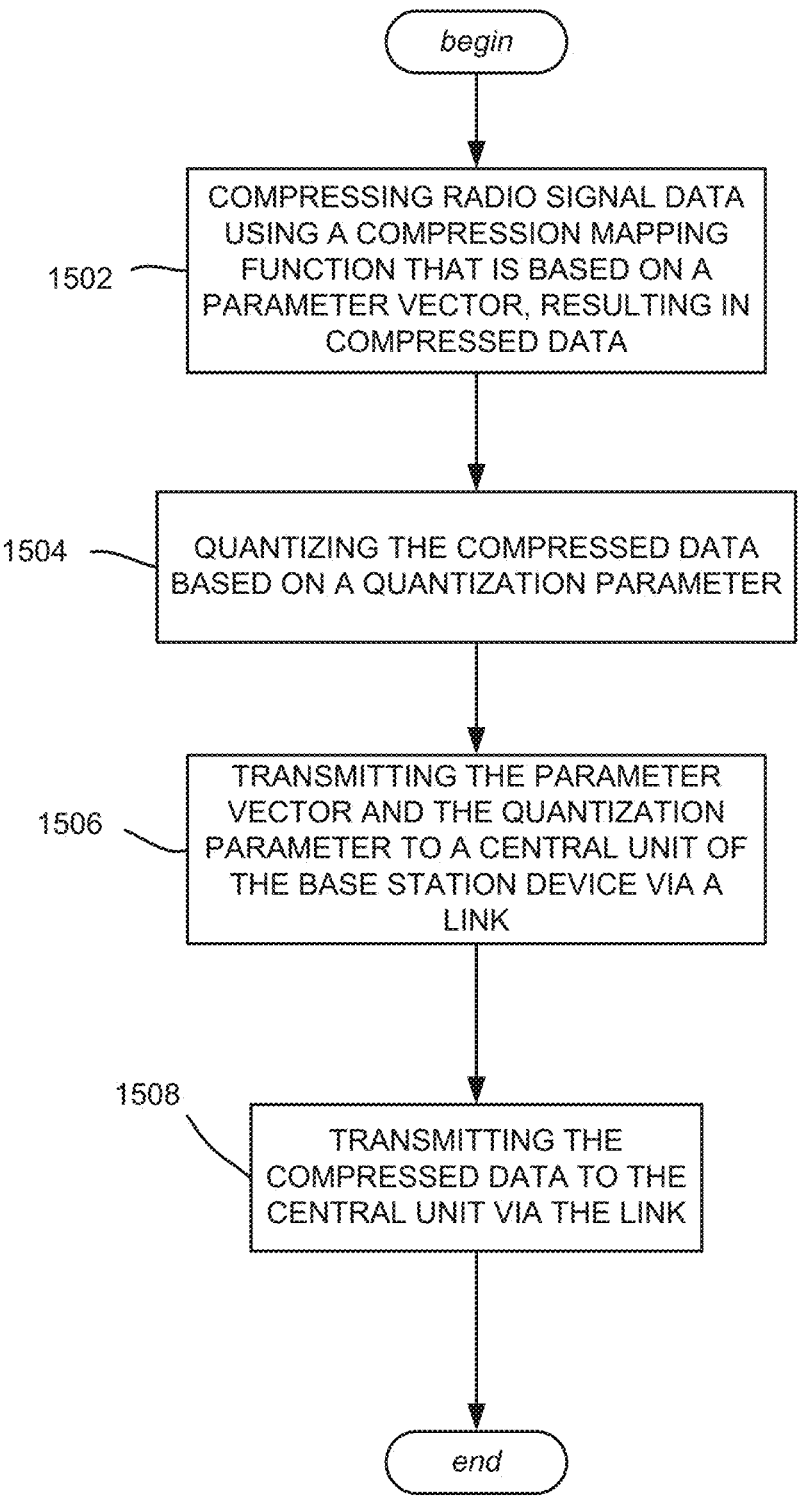
FIG. 15 illustrates an example flow diagram of network device operations for compressing data, in accordance with various aspects and implementations of the subject disclosure, in accordance with various aspects and implementations of the subject disclosure.

FIG. 15 represents operations, such as in the form of a machine-readable storage medium, comprising executable instructions that, when executed by a processor of a user equipment, facilitate performance of operations. Operation 1502 represents compressing radio signal data using a compression mapping function that is based on a parameter vector, resulting in compressed data. Operation 1504 represents quantizing the compressed data based on a quantization parameter. Operation 1506 represents transmitting the parameter vector and the quantization parameter to a central unit of the base station device via a link. Operation 1508 represents transmitting the compressed data to the central unit via the link.

Further operations can comprise decompressing compressed reference signals into decompressed reference signals and transmitting the decompressed reference signals to a user equipment. Other operations can comprise selecting the compression mapping function based on an architecture that the base station device is determined to be using.

Figure 16:
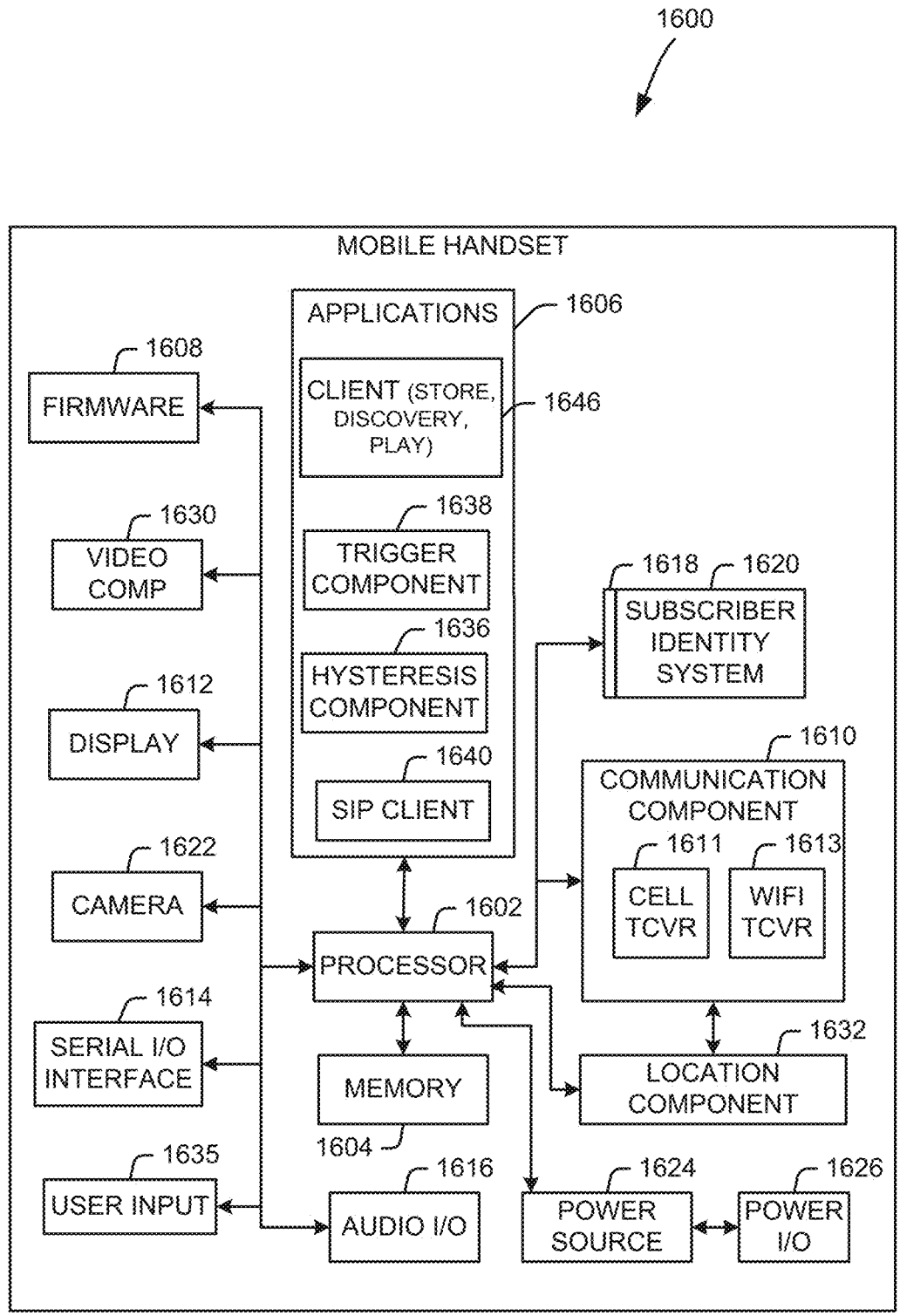
FIG. 16 illustrates an example block diagram of an example mobile handset operable to engage in a system architecture that facilitates wireless communications according to one or more embodiments described herein.

Referring now to FIG. 16, illustrated is an example block diagram of an example mobile handset 1600 operable to engage in a system architecture that facilitates wireless communications according to one or more embodiments described herein. Although a mobile handset is illustrated herein, it will be understood that other devices can be a mobile device, and that the mobile handset is merely illustrated to provide context for the embodiments of the various embodiments described herein. The following discussion is intended to provide a brief, general description of an example of a suitable environment in which the various embodiments can be implemented. While the description includes a general context of computer-executable instructions embodied on a machine-readable storage medium, those skilled in the art will recognize that the innovation also can be implemented in combination with other program modules and/or as a combination of hardware and software.

Generally, applications (e.g., program modules) can include routines, programs, components, data structures, etc., that perform particular tasks or implement particular abstract data types. Moreover, those skilled in the art will appreciate that the methods described herein can be practiced with other system configurations, including single-processor or multiprocessor systems, minicomputers, mainframe computers, as well as personal computers, hand-held computing devices, microprocessor-based or programmable consumer electronics, and the like, each of which can be operatively coupled to one or more associated devices A computing device can typically include a variety of machine-readable media. Machine-readable media can be any available media that can be accessed by the computer and includes both volatile and non-volatile media, removable and non-removable media. By way of example and not limitation, computer-readable media can comprise computer storage media and communication media. Computer storage media can include volatile and/or non-volatile media, removable and/or non-removable media implemented in any method or technology for storage of information, such as computer-readable instructions, data structures, program modules, or other data. Computer storage media can include, but is not limited to, RAM, ROM, EEPROM, flash memory or other memory technology, solid state drive (SSD) or other solid-state storage technology, Compact Disk Read Only Memory (CD ROM), digital video disk (DVD), Blu-ray disk, or other optical disk storage, magnetic cassettes, magnetic tape, magnetic disk storage or other magnetic storage devices, or any other medium which can be used to store the desired information and which can be accessed by the computer. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Communication media typically embodies computer-readable instructions, data structures, program modules, or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media The handset includes a processor 1602 for controlling and processing all onboard operations and functions. A memory 1604 interfaces to the processor 1602 for storage of data and one or more applications 1606 (e.g., a video player software, user feedback component software, etc.). Other applications can include voice recognition of predetermined voice commands that facilitate initiation of the user feedback signals. The applications 1606 can be stored in the memory 1604 and/or in a firmware 1608, and executed by the processor 1602 from either or both the memory 1604 or/and the firmware 1608. The firmware 1608 can also store startup code for execution in initializing the handset 1600. A communications component 1610 interfaces to the processor 1602 to facilitate wired/wireless communication with external systems, e.g., cellular networks, VoIP networks, and so on. Here, the communications component 1610 can also include a suitable cellular transceiver 1611 (e.g., a GSM transceiver) and/or an unlicensed transceiver 1613 (e.g., Wi-Fi, WiMax) for corresponding signal communications. The handset 1600 can be a device such as a cellular telephone, a PDA with mobile communications capabilities, and messaging-centric devices. The communications component 1610 also facilitates communications reception from terrestrial radio networks (e.g., broadcast), digital satellite radio networks, and Internet-based radio services networks The handset 1600 includes a display 1612 for displaying text, images, video, telephony functions (e.g., a Caller ID function), setup functions, and for user input. For example, the display 1612 can also be referred to as a "screen" that can accommodate the presentation of multimedia content (e.g., music metadata, messages, wallpaper, graphics, etc.). The display 1612 can also display videos and can facilitate the generation, editing and sharing of video quotes. A serial I/O interface 1614 is provided in communication with the processor 1602 to facilitate wired and/or wireless serial communications (e.g., USB, and/or IEEE 1694) through a hardwire connection, and other serial input devices (e.g., a keyboard, keypad, and mouse). This supports updating and troubleshooting the handset 1600, for example. Audio capabilities are provided with an audio I/O component 1616, which can include a speaker for the output of audio signals related to, for example, indication that the user pressed the proper key or key combination to initiate the user feedback signal. The audio I/O component 1616 also facilitates the input of audio signals through a microphone to record data and/or telephony voice data, and for inputting voice signals for telephone conversations.

The handset 1600 can include a slot interface 1618 for accommodating a SIC (Subscriber Identity Component) in the form factor of a card Subscriber Identity Module (SIM) or universal SIM 1620, and interfacing the SIM card 1620 with the processor 1602. However, it is to be appreciated that the SIM card 1620 can be manufactured into the handset 1600, and updated by downloading data and software.

The handset 1600 can process IP data traffic through the communications component 1610 to accommodate IP traffic from an IP network such as, for example, the Internet, a corporate intranet, a home network, a person area network, etc., through an ISP or broadband cable provider. Thus, VoIP traffic can be utilized by the handset 1600 and IP-based multimedia content can be received in either an encoded or a decoded format.

A video processing component 1622 (e.g., a camera) can be provided for decoding encoded multimedia content. The video processing component 1622 can aid in facilitating the generation, editing, and sharing of video quotes. The handset 1600 also includes a power source 1624 in the form of batteries and/or an AC power subsystem, which power source 1624 can interface to an external power system or charging equipment (not shown) by a power I/O component 1626.

The handset 1600 can also include a video component 1630 for processing video content received and, for recording and transmitting video content. For example, the video component 1630 can facilitate the generation, editing and sharing of video quotes. A location tracking component 1632 facilitates geographically locating the handset 1600. As described hereinabove, this can occur when the user initiates the feedback signal automatically or manually. A user input component 1634 facilitates the user initiating the quality feedback signal. The user input component 1634 can also facilitate the generation, editing and sharing of video quotes. The user input component 1634 can include such conventional input device technologies such as a keypad, keyboard, mouse, stylus pen, and/or touch screen, for example.

Referring again to the applications 1606, a hysteresis component 1636 facilitates the analysis and processing of hysteresis data, which is utilized to determine when to associate with the access point. A software trigger component 1638 can be provided that facilitates triggering of the hysteresis component 1636 when the Wi-Fi transceiver 1613 detects the beacon of the access point. A SIP client 1640 enables the handset 1600 to support SIP protocols and register the subscriber with the SIP registrar server. The applications 1606 can also include a client 1642 that provides at least the capability of discovery, play and store of multimedia content, for example, music.

The handset 1600, as indicated above related to the communications component 1610, includes an indoor network radio transceiver 1613 (e.g., Wi-Fi transceiver). This function supports the indoor radio link, such as IEEE 802.11, for the dual-mode GSM handset 1600. The handset 1600 can accommodate at least satellite radio services through a handset that can combine wireless voice and digital radio chipsets into a single handheld device.

Figure 17:
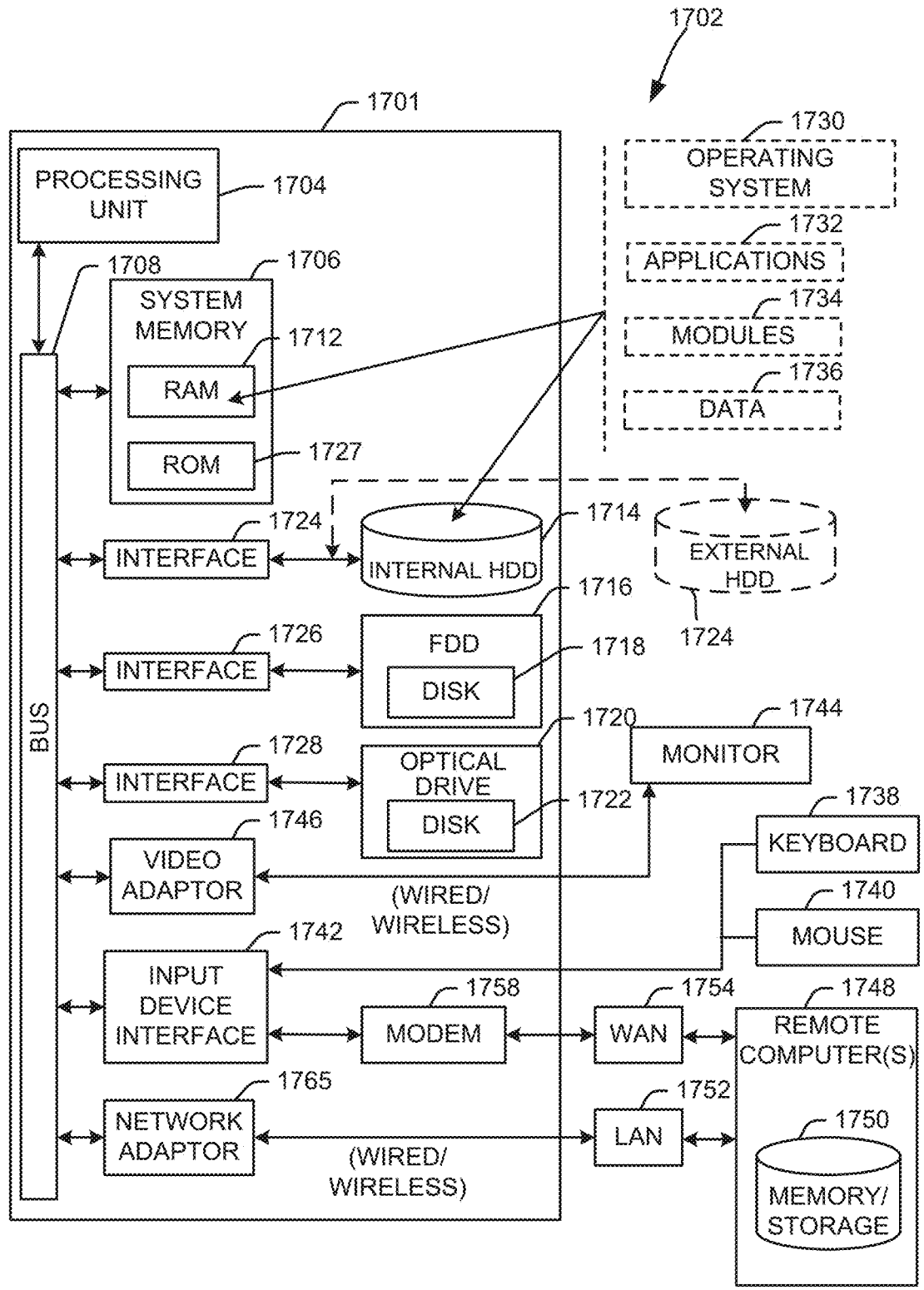
FIG. 17 illustrates an example block diagram of an example computer operable to engage in a system architecture that facilitates wireless communications according to one or more embodiments described herein.

Referring now to FIG. 17, illustrated is an example block diagram of an example computer 1700 operable to engage in a system architecture that facilitates wireless communications according to one or more embodiments described herein. The computer 1700 can provide networking and communication capabilities between a wired or wireless communication network and a server (e.g., Microsoft server) and/or communication device. In order to provide additional context for various aspects thereof, FIG. 17 and the following discussion are intended to provide a brief, general description of a suitable computing environment in which the various aspects of the innovation can be implemented to facilitate the establishment of a transaction between an entity and a third party. While the description above is in the general context of computer-executable instructions that can run on one or more computers, those skilled in the art will recognize that the innovation also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the innovation can also be practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media or communications media, which two terms are used herein differently from one another as follows.

Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media can embody computer-readable instructions, data structures, program modules, or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

The techniques described herein can be applied to any device or set of devices (machines) capable of running programs and processes. It can be understood, therefore, that servers including physical and/or virtual machines, personal computers, laptops, handheld, portable and other computing devices and computing objects of all kinds including cell phones, tablet/slate computers, gaming/entertainment consoles and the like are contemplated for use in connection with various implementations including those exemplified herein. Accordingly, the general purpose computing mechanism described below with reference to FIG. 17 is but one example of a computing device.

In order to provide a context for the various aspects of the disclosed subject matter, FIG. 17 and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules include routines, programs, components, data structures, etc. that perform particular tasks and/or implement particular abstract data types.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can include both volatile and nonvolatile memory, by way of illustration, and not limitation, volatile memory 1720 (see below), non-volatile memory 1722 (see below), disk storage 1724 (see below), and memory storage 1746 (see below). Further, nonvolatile memory can be included in read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Moreover, it will be noted that the disclosed subject matter can be practiced with other computer system configurations, including single-processor or multiprocessor computer systems, mini-computing devices, mainframe computers, as well as personal computers, hand-held computing devices (e.g., PDA, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

FIG. 17 illustrates a block diagram of a computing system 1700 operable to execute the disclosed systems and methods in accordance with an embodiment. Computer 1712, which can be, for example, part of the hardware of system 1720, includes a processing unit 1714, a system memory 1716, and a system bus 1718. System bus 1718 couples system components including, but not limited to, system memory 1716 to processing unit 1714. Processing unit 1714 can be any of various available processors. Dual microprocessors and other multiprocessor architectures also can be employed as processing unit 1714.

System bus 1718 can be any of several types of bus structure(s) including a memory bus or a memory controller, a peripheral bus or an external bus, and/or a local bus using any variety of available bus architectures including, but not limited to, Industrial Standard Architecture (ISA), Micro-Channel Architecture (MSA), Extended ISA (EISA), Intelligent Drive Electronics, VESA Local Bus (VLB), Peripheral Component Interconnect (PCI), Card Bus, Universal Serial Bus (USB), Advanced Graphics Port (AGP), Personal Computer Memory Card International Association bus (PC-MCIA), Firewire (IEEE 1794), and Small Computer Systems Interface (SCSI).

System memory 1716 can include volatile memory 1720 and nonvolatile memory 1722. A basic input/output system (BIOS), containing routines to transfer information between elements within computer 1712, such as during start-up, can be stored in nonvolatile memory 1722. By way of illustration, and not limitation, nonvolatile memory 1722 can include ROM, PROM, EPROM, EEPROM, or flash memory. Volatile memory 1720 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1712 can also include removable/non-removable, volatile/non-volatile computer storage media. FIG. 17 illustrates, for example, disk storage 1724. Disk storage 1724 includes, but is not limited to, devices like a magnetic disk drive, floppy disk drive, tape drive, flash memory card, or memory stick. In addition, disk storage 1724 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1724 to system bus 1718, a removable or non-removable interface is typically used, such as interface 1726.

Computing devices typically include a variety of media, which can include computer-readable storage media or communications media, which two terms are used herein differently from one another as follows.

Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, random access memory (RAM), read only memory (ROM), electrically erasable programmable read only memory (EEPROM), flash memory or other memory technology, solid state drive (SSD) or other solid-state storage technology, compact disk read only memory (CD ROM), digital versatile disk (DVD), Blu-ray disc or other optical disk storage, magnetic cassettes, magnetic tape, magnetic disk storage or other magnetic storage devices or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se. In an aspect, tangible media can include non-transitory media wherein the term "non-transitory" herein as may be applied to storage, memory or computer-readable media, is to be understood to exclude only propagating transitory signals per se as a modifier and does not relinquish coverage of all standard storage, memory or computer-readable media that are not only propagating transitory signals per se. For the avoidance of doubt, the term "computer-readable storage device" is used and defined herein to exclude transitory media. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

It can be noted that FIG. 17 describes software that acts as an intermediary between users and computer resources described in suitable operating environment 1700. Such software includes an operating system 1728. Operating system 1728, which can be stored on disk storage 1724, acts to control and allocate resources of computer system 1712. System applications 1730 take advantage of the management of resources by operating system 1728 through program modules 1732 and program data 1734 stored either in system memory 1716 or on disk storage 1724. It is to be noted that the disclosed subject matter can be implemented with various operating systems or combinations of operating systems.

A user can enter commands or information into computer 1712 through input device(s) 1736. As an example, a mobile device and/or portable device can include a user interface embodied in a touch sensitive display panel allowing a user to interact with computer 1712. Input devices 1736 include, but are not limited to, a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 1714 through system bus 1718 by way of interface port(s) 1738. Interface port(s) 1738 include, for example, a serial port, a parallel port, a game port, a universal serial bus (USB), an infrared port, a Bluetooth port, an IP port, or a logical port associated with a wireless service, etc. Output device(s) 1740 and a move use some of the same type of ports as input device(s) 1736.

Thus, for example, a USB port can be used to provide input to computer 1712 and to output information from computer 1712 to an output device 1740. Output adapter 1742 is provided to illustrate that there are some output devices 1740 like monitors, speakers, and printers, among other output devices 1740, which use special adapters. Output adapters 1742 include, by way of illustration and not limitation, video and sound cards that provide means of connection between output device 1740 and system bus 1718. It should be noted that other devices and/or systems of devices provide both input and output capabilities such as remote computer(s) 1744.

Computer 1712 can operate in a networked environment using logical connections to one or more remote computers, such as remote computer(s) 1744. Remote computer(s) 1744 can be a personal computer, a server, a router, a network PC, cloud storage, cloud service, a workstation, a microprocessor based appliance, a peer device, or other common network node and the like, and typically includes many or all of the elements described relative to computer 1712.

For purposes of brevity, only a memory storage device 1746 is illustrated with remote computer(s) 1744. Remote computer(s) 1744 is logically connected to computer 1712 through a network interface 1748 and then physically connected by way of communication connection 1750. Network interface 1748 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit-switching networks like Integrated Services Digital Networks (ISDN) and variations thereon, packet switching networks, and Digital Subscriber Lines (DSL). As noted below, wireless technologies may be used in addition to or in place of the foregoing.

Communication connection(s) 1750 refer(s) to hardware/software employed to connect network interface 1748 to bus 1718. While communication connection 1750 is shown for illustrative clarity inside computer 1712, it can also be external to computer 1712. The hardware/software for connection to network interface 1748 can include, for example, internal and external technologies such as modems, including regular telephone grade modems, cable modems and DSL modems, ISDN adapters, and Ethernet cards.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can include both volatile and nonvolatile memory.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media, device readable storage devices, or machine readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

Moreover, terms like "user equipment (UE)," "mobile station," "mobile," subscriber station," "subscriber equipment," "access terminal," "terminal," "handset," and similar terminology, refer to a wireless device utilized by a subscriber or user of a wireless communication service to receive or convey data, control, voice, video, sound, gaming, or substantially any data-stream or signaling-stream. The foregoing terms are utilized interchangeably in the subject specification and related drawings. Likewise, the terms "access point (AP)," "base station," "NodeB," "evolved Node B (eNodeB)," "home Node B (HNB)," "home access point (HAP)," "cell device," "sector," "cell," and the like, are utilized interchangeably in the subject application, and refer to a wireless network component or appliance that serves and receives data, control, voice, video, sound, gaming, or substantially any data-stream or signaling-stream to and from a set of subscriber stations or provider enabled devices. Data and signaling streams can include packetized or frame-based flows.

Additionally, the terms "core-network", "core", "core carrier network", "carrier-side", or similar terms can refer to components of a telecommunications network that typically provides some or all of aggregation, authentication, call control and switching, charging, service invocation, or gateways. Aggregation can refer to the highest level of aggregation in a service provider network wherein the next level in the hierarchy under the core nodes is the distribution networks and then the edge networks. UEs do not normally connect directly to the core networks of a large service provider but can be routed to the core by way of a switch or radio area network. Authentication can refer to determinations regarding whether the user requesting a service from the telecom network is authorized to do so within this network or not. Call control and switching can refer determinations related to the future course of a call stream across carrier equipment based on the call signal processing. Charging can be related to the collation and processing of charging data generated by various network nodes. Two common types of charging mechanisms found in present day networks can be prepaid charging and postpaid charging. Service invocation can occur based on some explicit action (e.g. call transfer) or implicitly (e.g., call waiting). It is to be noted that service "execution" may or may not be a core network functionality as third party network/nodes may take part in actual service execution. A gateway can be present in the core network to access other networks. Gateway functionality can be dependent on the type of the interface with another network.

Furthermore, the terms "user," "subscriber," "customer," "consumer," "prosumer," "agent," and the like are employed interchangeably throughout the subject specification, unless context warrants particular distinction(s) among the terms. It should be appreciated that such terms can refer to human entities or automated components (e.g., supported through artificial intelligence, as through a capacity to make inferences based on complex mathematical formalisms), that can provide simulated vision, sound recognition and so forth.

Aspects, features, or advantages of the subject matter can be exploited in substantially any, or any, wired, broadcast, wireless telecommunication, radio technology or network, or combinations thereof. Non-limiting examples of such technologies or networks include Geocast technology; broadcast technologies (e.g., sub-Hz, ELF, VLF, LF, MF, HF, VHF, UHF, SHF, THz broadcasts, etc.); Ethernet; X.25;

powerline-type networking (e.g., PowerLine AV Ethernet, etc.); femto-cell technology; Wi-Fi; Worldwide Interoperability for Microwave Access (WiMAX); Enhanced General Packet Radio Service (Enhanced GPRS); Third Generation Partnership Project (3GPP or 3G) Long Term Evolution (LTE); 3GPP Universal Mobile Telecommunications System (UMTS) or 3GPP UMTS; Third Generation Partnership Project 2 (3GPP2) Ultra Mobile Broadband (UMB); High Speed Packet Access (HSPA); High Speed Downlink Packet Access (HSDPA); High Speed Uplink Packet Access (HSUPA); GSM Enhanced Data Rates for GSM Evolution (EDGE) Radio Access Network (RAN) or GERAN; UMTS Terrestrial Radio Access Network (UTRAN); or LTE Advanced.

What has been described above includes examples of systems and methods illustrative of the disclosed subject matter. It is, of course, not possible to describe every combination of components or methods herein. One of ordinary skill in the art may recognize that many further combinations and permutations of the disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

While the various embodiments are susceptible to various modifications and alternative constructions, certain illustrated implementations thereof are shown in the drawings and have been described above in detail. It should be understood, however, that there is no intention to limit the various embodiments to the specific forms disclosed, but on the contrary, the intention is to cover all modifications, alternative constructions, and equivalents falling within the spirit and scope of the various embodiments.

In addition to the various implementations described herein, it is to be understood that other similar implementations can be used or modifications and additions can be made to the described implementation(s) for performing the same or equivalent function of the corresponding implementation(s) without deviating therefrom. Still further, multiple processing chips or multiple devices can share the performance of one or more functions described herein, and similarly, storage can be effected across a plurality of devices. Accordingly, the invention is not to be limited to any single implementation, but rather is to be construed in breadth, spirit and scope in accordance with the appended claims.

What is claimed is:

1. A method, comprising:
    transmitting, by a transmitter of a cellular base station device comprising an analog front end of a radio device coupled to a digital baseband processor of a central device, radio signal data to a receiver via a link, wherein operations associated with the transmitting comprise:
        selecting, by the transmitter, a compression mapping function for compression of the radio signal data, wherein the selecting comprises:
            selecting a first compression mapping function as the compression mapping function in response to the transmitting employing hybrid beamforming, and
            selecting a second compression mapping function as the compression mapping function in response to the transmitting employing digital beamforming, wherein the first compression mapping function is different from the second compression mapping function;
        compressing, by the transmitter, the radio signal data using the compression mapping function that is based on a parameter vector, resulting in compressed data;
        quantizing, by the transmitter, the compressed data based on a quantization parameter;
        transmitting, by the transmitter, the parameter vector to the receiver; and
        transmitting, by the transmitter, the compressed data to the receiver.

2. The method of claim 1, wherein the radio device operates as the transmitter of the cellular base station device, wherein the compressed data corresponds to uplink data, and wherein the method further comprises determining, by the radio device, the parameter vector based on an estimated amount of the uplink data.

3. The method of claim 1, wherein the operations associated with the transmitting further comprise transmitting, by the transmitter, the quantization parameter to the receiver.

4. The method of claim 3, wherein the radio device operates as the transmitter of the cellular base station device, wherein the compressed data corresponds to uplink data, and wherein the method further comprises determining, by the radio device, the quantization parameter based on an estimated amount of the uplink data.

5. The method of claim 3, wherein the central device operates as the transmitter of the cellular base station device, wherein the compressed data corresponds to downlink data, and wherein the method further comprises determining, by the central device, the parameter vector based on information received from a scheduler.

6. The method of claim 3, wherein the central device operates as the transmitter of the cellular base station device, wherein the compressed data corresponds to downlink data, and wherein the method further comprises determining, by the central device, the quantization parameter based on an estimated amount of the downlink data.

7. The method of claim 1, wherein the transmitting the compressed data to the receiver comprises transmitting the compressed data via a serial link or an IP network.

8. The method of claim 1, further comprising estimating a channel between the cellular base station device and a user equipment using reference signals originating from the central device.

9. The method of claim 8, wherein the operations associated with the transmitting further comprise compressing, by the transmitter, the reference signals with a third compression mapping function having a higher resolution than respective resolutions of the first compression mapping function and the second compression mapping function.

10. The method of claim 8, wherein the operations associated with the transmitting further comprise compressing, by the transmitter, a demodulation reference signal of the reference signals with a third compression mapping function that is different than the first compression mapping function and the second compression mapping function.

11. The method of claim 1, further comprising selecting, by the transmitter, a number of bits for the compressing based on a network architecture determined to be applicable to the cellular base station device.

12. A radio network device, comprising:
    a processor; and a memory that stores executable instructions that, when executed by the processor, facilitate performance of operations, the operations comprising:
  compressing radio signal data with a compression mapping function that is based on a parameter vector, into compressed data, wherein the compressing comprises:
    selecting a first compression mapping function as the compression mapping function in response to determining that hybrid beamforming is to be employed for a transmission of the compressed data, and
    selecting a second compression mapping function as the compression mapping function in response to determining that digital beamforming is to be employed for the transmission of the compressed data, wherein the first compression mapping function is different from the second compression mapping function;
  quantizing the compressed data based on a quantization parameter; and
  transmitting the compressed data from a transmitter associated with the radio network device to a receiver associated with the radio network device.

13. The radio network device of claim 12, wherein the operations further comprise transmitting the parameter vector and quantization parameter to the receiver.

14. The radio network device of claim 13, wherein the operations further comprise receiving the parameter vector and quantization parameter at the receiver, and decompressing the compressed data by the receiver.

15. The radio network device of claim 12, wherein the transmitter comprises a central device, and wherein operations further comprise estimating a channel between a user equipment and the radio network device based on reference signals sent from the transmitter to the receiver.

16. The radio network device of claim 15, wherein the operations further comprise, compressing the reference signals sent from the transmitter to the receiver.

17. The radio network device of claim 15, wherein the operations further comprise, compressing the reference signals sent from the transmitter to the receiver, comprising using a first reference signal compression function for demodulation reference signals and a second reference signal compression function for other reference signals other than the demodulation reference signals.

18. A machine-readable storage medium, comprising executable instructions that, when executed by a processor of a radio unit of a base station device, facilitate performance of operations, the operations comprising:
  compressing radio signal data using a compression mapping function that is based on a parameter vector, resulting in compressed data, wherein the compressing comprises:
    selecting a first compression mapping function as the compression mapping function in response to determining that hybrid beamforming will be employed for a transmission of the compressed data, and
    selecting a second compression mapping function as the compression mapping function in response to determining that digital beamforming will be employed for the transmission of the compressed data, wherein the first compression mapping function is different from the second compression mapping function;
  quantizing the compressed data based on a quantization parameter;
  transmitting the parameter vector and the quantization parameter to a central unit of the base station device via a link; and
  transmitting the compressed data to the central unit via the link.

19. The machine-readable storage medium of claim 18, wherein the operations further comprise, decompressing compressed reference signals into decompressed reference signals and transmitting the decompressed reference signals to a user equipment.

20. The machine-readable storage medium of claim 18, wherein the operations further comprise, selecting a number of bits for the compressing based on an architecture that the base station device is determined to be using.

* * * * *